(12) United States Patent
Okamoto et al.

(10) Patent No.: US 12,284,828 B2
(45) Date of Patent: Apr. 22, 2025

(54) SEMICONDUCTOR DEVICE

(71) Applicant: Socionext Inc., Kanagawa (JP)

(72) Inventors: Atsushi Okamoto, Yokohama (JP);
Hirotaka Takeno, Yokohama (JP);
Wenzhen Wang, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 426 days.

(21) Appl. No.: 17/829,341

(22) Filed: May 31, 2022

(65) Prior Publication Data

US 2022/0293634 A1   Sep. 15, 2022

Related U.S. Application Data

(63) Continuation of application No. PCT/JP2019/047688, filed on Dec. 5, 2019.

(51) Int. Cl.
*H10D 84/90* (2025.01)
(52) U.S. Cl.
CPC ......... *H10D 84/907* (2025.01); *H10D 84/975* (2025.01); *H10D 84/981* (2025.01); *H10D 84/992* (2025.01)
(58) Field of Classification Search
CPC ..... H01L 27/11807; H01L 2027/11875; H01L 2027/11881; H01L 2027/11892; H01L 23/535; H01L 23/481; H01L 23/5286; H01L 27/092; H01L 27/0207
See application file for complete search history.

(56) References Cited

U.S. PATENT DOCUMENTS

| | | | |
|---|---|---|---|
| 8,530,273 | B2 | 9/2013 | Den Boer |
| 9,754,923 | B1 | 9/2017 | Xie et al. |
| 10,950,546 | B1 | 3/2021 | Doornbos |
| 11,004,789 | B2 | 5/2021 | Doornbos et al. |
| 2013/0300462 | A1 | 11/2013 | Koyama et al. |
| 2015/0162448 | A1 | 6/2015 | Raghavan et al. |
| 2015/0187642 | A1 | 7/2015 | Batra et al. |
| 2018/0145030 | A1 | 5/2018 | Beyne et al. |

(Continued)

FOREIGN PATENT DOCUMENTS

| | | |
|---|---|---|
| JP | S53-026689 A | 3/1978 |
| JP | H05-206420 A | 8/1993 |
| JP | H11-102910 A | 4/1999 |

(Continued)

OTHER PUBLICATIONS

International Search Report (ISR) dated Feb. 4, 2020 issued in International Patent Application No. PCT/JP2019/047688, with English translation.

*Primary Examiner* — Elias Ullah
(74) *Attorney, Agent, or Firm* — Rimon P.C.

(57) ABSTRACT

A semiconductor device includes a first chip including a substrate and a first wiring layer formed on a first surface of the substrate; and a second wiring layer formed on a second surface of the substrate opposite to the first surface of the substrate. The second wiring layer includes a first power line to which a first power potential is applied; a second power line to which a second power potential is applied; a third power line to which a third power potential is applied; a first switch connected between the first power line and the second power line; and a second switch provided on one of the first power line or the third power line. The first chip includes a first circuit provided between the first power line and the third power line.

15 Claims, 25 Drawing Sheets

(56) References Cited

U.S. PATENT DOCUMENTS

2021/0020571 A1   1/2021   Okamoto et al.

FOREIGN PATENT DOCUMENTS

| JP | 2009-302198 A | 12/2009 |
| JP | 2011-159810 A | 8/2011 |
| JP | 2012-044042 A | 3/2012 |
| JP | 2014-165358 A | 9/2014 |
| JP | 2018-107463 A | 7/2018 |
| WO | 2019/194007 A1 | 10/2019 |

SEMICONDUCTOR DEVICE

CROSS-REFERENCE TO RELATED APPLICATION

The present application is a continuation of the international application No. PCT/JP2019/047688, filed on Dec. 5, 2019, and designated the U.S., the entire contents of which are incorporated herein by reference.

BACKGROUND OF THE INVENTION

1. Field of the Invention

The present disclosure relates to a semiconductor device.

2. Description of the Related Art

A semiconductor device includes various circuit regions, one example of which is a standard cell region. The standard cell region includes various logic circuits. In a case where a VDD power potential is supplied to the semiconductor device, a VVDD power potential is supplied to logic circuits in the standard cell region, and a switch, such as a transistor, may be connected between the VDD power line and the VVDD power line.

The switch turns on and off supply of the VVDD power potential to transistors included in the logic circuits. By using the switch, power supply is turned off when there is no need to operate the logic circuits, and leakage currents in the transistors of the logic circuits can be reduced, resulting in reduction of the power consumption.

A technique has been proposed in which a sub-semiconductor chip including wirings is provided on a back side of a main semiconductor chip and a power potential is supplied to transistors of the main semiconductor chip via the wirings of the sub-semiconductor chip. Such a technique is sometimes called a backside-power delivery network (BS-PDN).

PRIOR ART DOCUMENTS

Patent Documents

[Patent Document 1] U.S. Patent Application Publication No. 2015/0162448
[Patent Document 2] U.S. Pat. No. 9,754,923
[Patent Document 3] U.S. Patent Application Publication No. 2018/0145030
[Patent Document 4] U.S. Pat. No. 8,530,273
[Patent Document 5] Japanese Patent No. 6469269

SUMMARY

A semiconductor device includes a first chip including a substrate and a first wiring layer formed on a first surface of the substrate; and a second wiring layer formed on a second surface of the substrate opposite to the first surface of the substrate. The second wiring layer includes a first power line to which a first power potential is applied; a second power line to which a second power potential is applied; a third power line to which a third power potential is applied; a first switch connected between the first power line and the second power line; and a second switch provided on one of the first power line or the third power line. The first chip includes a first circuit provided between the first power line and the third power line.

The object and advantages of the invention will be implemented and attained by the elements and combinations particularly pointed out in the appended claims.

It is to be understood that both the foregoing general description and the following detailed description are exemplary and explanatory and are not restrictive of the invention as claimed.

BRIEF DESCRIPTION OF DRAWINGS

Other objects and further features of embodiments will become apparent from the following detailed description when read in conjunction with the accompanying drawings, in which.

DESCRIPTION OF EMBODIMENTS

Figure 1:
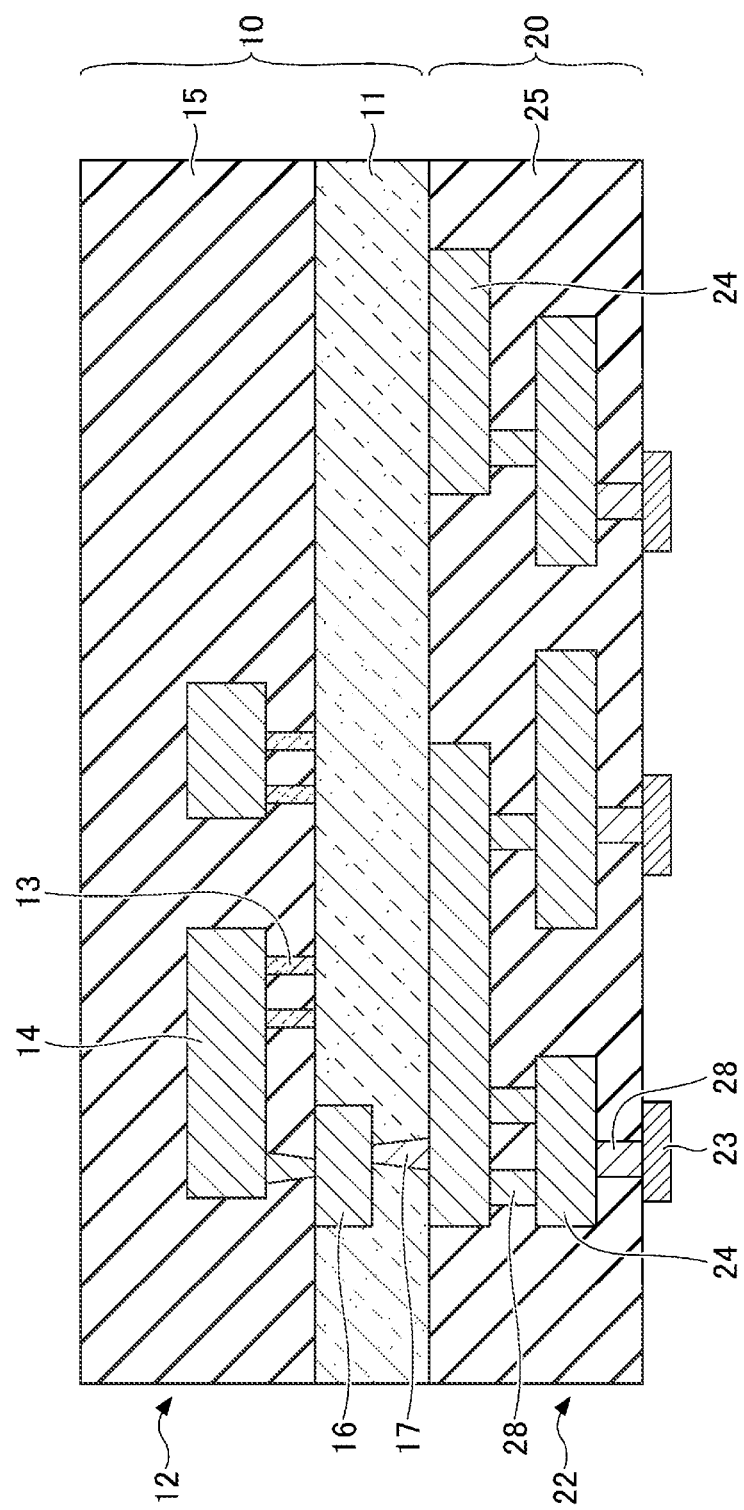
FIG. 1 is a cross-sectional view depicting an overview of a semiconductor device to which the present disclosure is applied.

In the related art described above, no detailed consideration has been made for a specific configuration in case of providing the switch in a sub-semiconductor chip including wirings.

It is an object of the present disclosure to provide a semiconductor device in which the switch can be provided appropriately.

According to the disclosed technique, the switch can be provided appropriately.

Hereinafter, embodiments will be described in detail with reference to the accompanying drawings. In the present specification and the drawings, duplicate explanations of components having substantially the same functional configurations may be omitted by providing the same reference numerals. In the following description, two directions parallel to a surface of a substrate and perpendicular to each other are referred to as a X-direction and a Y-direction, respectively; and a direction perpendicular to the surface of the substrate is referred to as a Z-direction. Moreover, layouts being the same as each other in the present disclosure does not strictly mean that any difference due to a manufacturing variation is not allowed, and even if a difference occurs between the layouts due to a manufacturing variation, the layouts can be regarded as being the same as each other.

(Overview of Semiconductor Device to which Present Disclosure is Applied)

First, an overview of a semiconductor device to which the present disclosure is applied will be described. FIG. 1 is a cross-sectional view depicting an overview of a semiconductor device to which the present disclosure is applied. The semiconductor device depicted in FIG. 1 includes a first chip 10 and a second chip 20.

The first chip 10 is, for example, a semiconductor chip and includes a substrate 11 and a first wiring layer 12. The substrate 11 is, for example, a silicon substrate, and the semiconductor device, such as a transistor, is formed on the front side of the substrate 11. The transistor is a FinFET including, for example, fins 13 in a source, a drain and a channel. The first wiring layer 12 is formed on the front surface of the substrate 11 and includes wirings 14 and an insulating layer 15. Portions of the wirings 14 are connected to the fins 13. For example, a power line 16 is formed on the front side of the substrate 11, and a via 17 is provided in the substrate 11 extending from the power line 16 to the back side of the substrate 11. The via 17 is, for example, a silicon-penetrating via (through-silicon via: TSV). As depicted in FIG. 1, a portion of the wiring 14 may have a via-like configuration and be connected to the power line 16. The wirings 14 and the power line 16 are made of materials such as copper, tungsten, cobalt, ruthenium, molybdenum, or the like.

The second chip 20 is, for example, a semiconductor chip and faces the back side of the substrate 11 of the first chip 10. The second chip 20 includes, for example, a second wiring layer 22 and pads 23. The second wiring layer 22 includes wirings 24 and an insulating layer 25. The top surface of the second wiring layer 22 faces the back side of the substrate 11 of the first chip 10, for example. That is, the substrate 11 is located between the first wiring layer 12 and the second wiring layer 22. The second wiring layer 22 may include a plurality of wirings 24, as depicted in FIG. 1. The plurality of wirings 24 may be connected via vias 28 provided in the second wiring layer 22. The pads 23 are external connection terminals connected to, for example, an wiring substrate or board. A portion of the wirings 24 is connected to the via 17. The pads 23 are provided on the back side of the second wiring layer 22 and are connected to the wirings 24 via vias 28. The second wiring layer 22 is supplied with power potentials and signals transmitted through the pads 23. The wirings 24 and the vias 28 are made of, for example, copper, tungsten, cobalt, ruthenium, molybdenum, or the like.

The second chip 20 may be as large as the first chip 10 or larger than the first chip 10. The pads 23 may be provided, outside the first chip 10 in plan view, on the first-chip-10-side surface of the second chip 20. Hereinafter, a plan view with respect to the principal surface of the first chip 10 will be referred to as a plan view.

The second wiring layer 22 may be provided as a result of the wirings 24, the insulating layer 25, and the like being formed on the back side of the substrate 11. The second wiring layer 22 may be formed on a second substrate in which a TSV is formed and the pads 23 may be provided on the back side of the second substrate.

Figure 10:
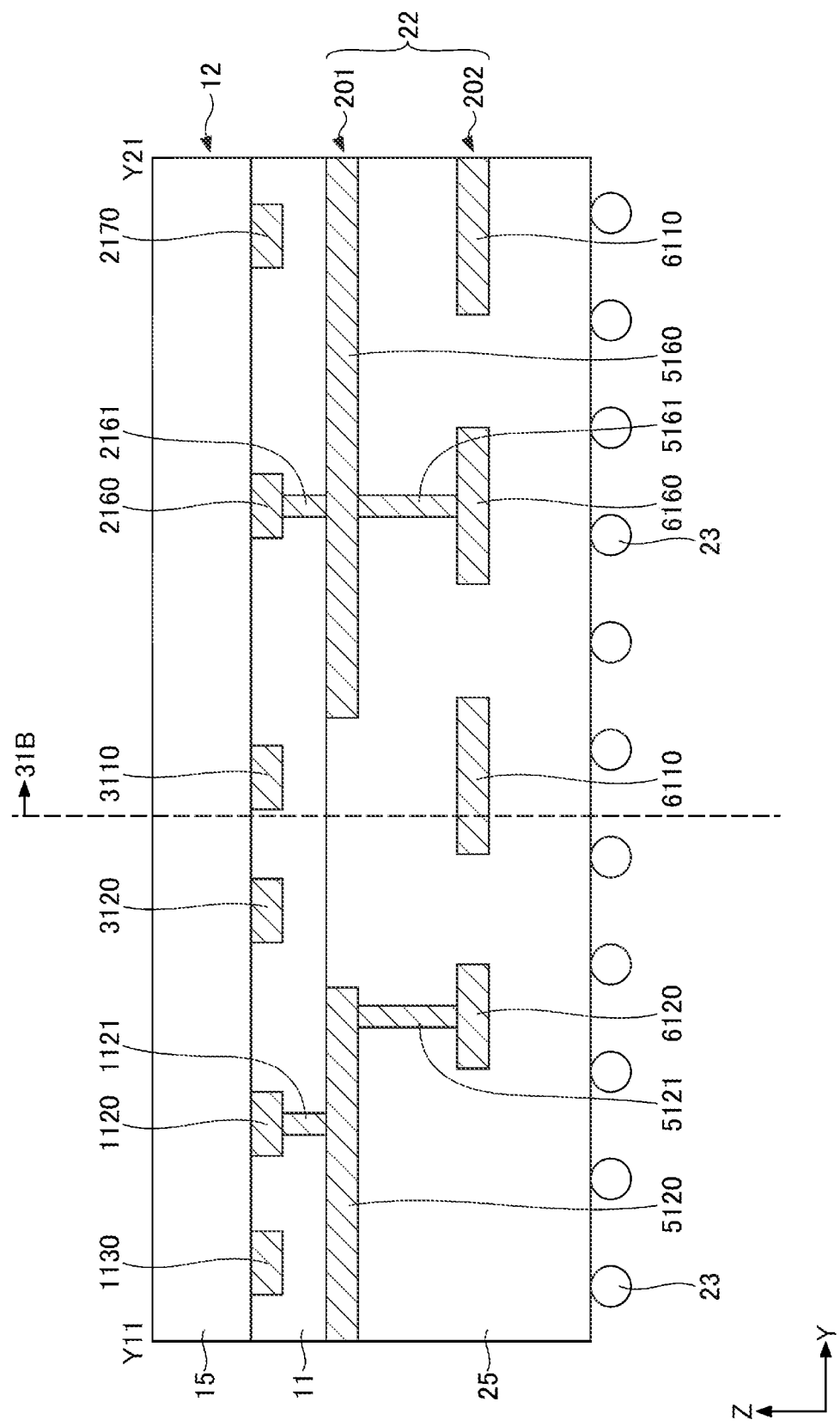
FIG. 10 is a cross-sectional view depicting the semiconductor device according to the first embodiment.
Figure 11:
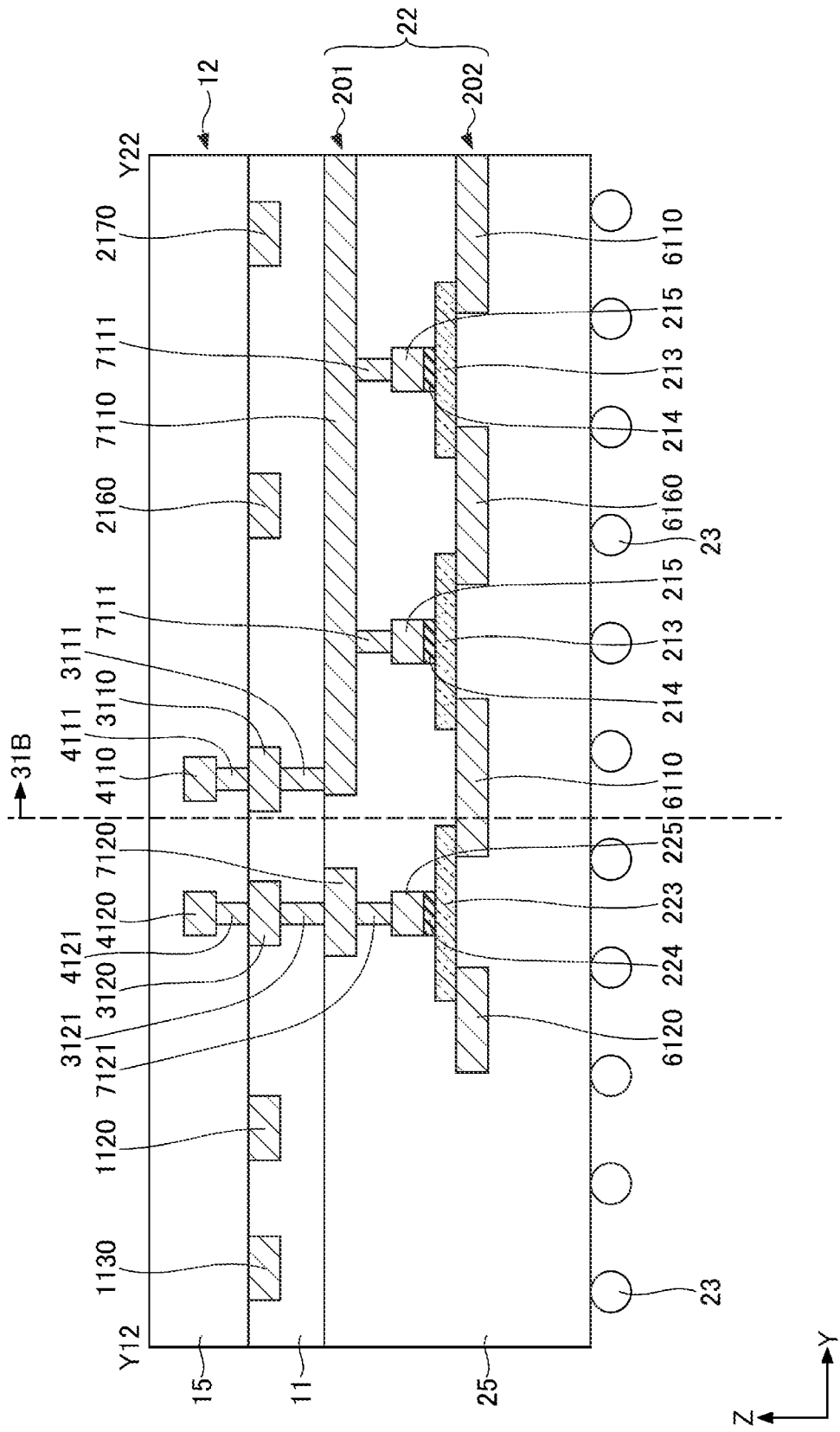
FIG. 11 is a cross-sectional view depicting the semiconductor device according to the first embodiment.

The cross-sectional view depicted in FIG. 1 is an outline of the semiconductor device, and details thereof are depicted in FIGS. 10 and 11, etc.

Figure 2:
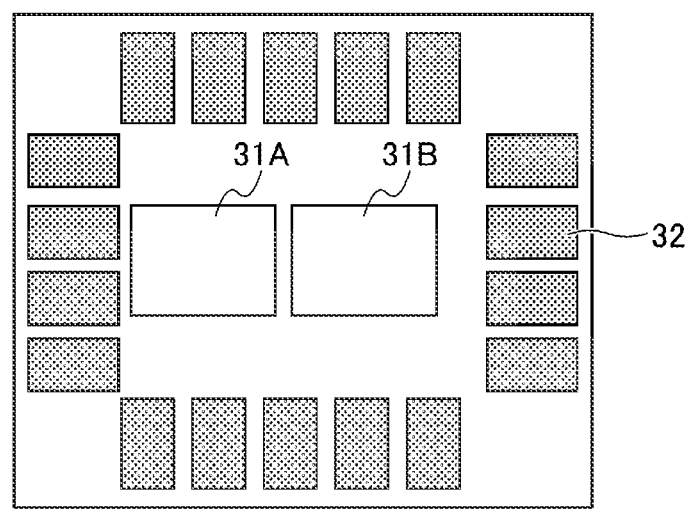
FIG. 2 is a diagram depicting a layout in a first chip.

Next, the layout in the first chip 10 will be described. FIG. 2 is a diagram depicting a layout in the first chip 10.

As depicted in FIG. 2, the first chip 10 includes a first power domain 31A, a second power domain 31B, and input and output (I/O) cell regions 32. The I/O cell regions 32 are disposed, for example, around the first power domain 31A and the second power domain 31B. The number of first power domains 31A and the number of second power domains 31B may be two or more.

[Circuits in Semiconductor Device]

Figure 3:
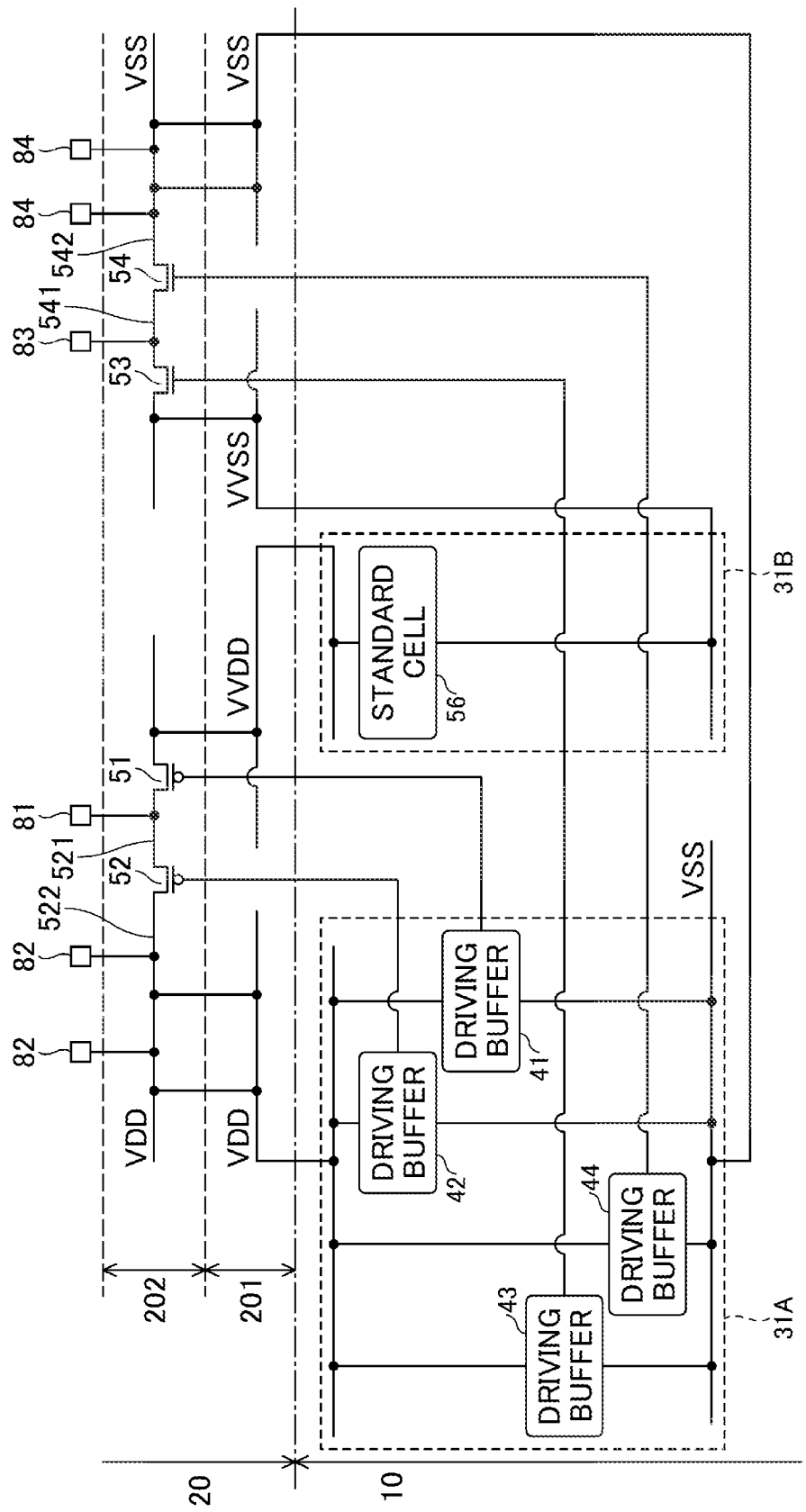
FIG. 3 is a circuit diagram depicting an example of a configuration of a circuit included in the semiconductor device.

Next, circuits included in the semiconductor device will be described. FIG. 3 is a circuit diagram depicting an example configuration of circuits included in the semiconductor device.

As depicted in FIG. 3, the semiconductor device has a first driving buffer 41, a second driving buffer 42, a third driving buffer 43, and a fourth driving buffer 44 in the first power domain 31A. The semiconductor device has a standard cell 56 in the second power domain 31B. The semiconductor device includes a VDD wiring to which a VDD power potential is applied, a VVDD wiring to which a VVDD power potential is applied, a VSS wiring to which a VSS power potential is applied, and a VVSS wiring to which a VVSS power potential is applied. For example, the VSS power potential is a ground potential and the VSS wiring is a grounding wiring.

The first to fourth driving buffers 41-44 in the first power domain 31A are provided with the VDD power potential and the VSS power potential.

The standard cell 56 in the second power domain 31B is provided with the VVDD power potential and the VVSS power potential. The standard cell 56 includes various logic circuits such as, for example, a NAND circuit, an inverter, and the like. The standard cell 56 may include a static random access memory (SRAM) or a macro. In FIG. 3, the VDD wiring may be connected to the standard cell 56 instead of the VVDD wiring being provided, or the VSS wiring may be connected to the standard cell 56 instead of the VVSS wiring being provided. In this case, the standard cell 56 is supplied with the VVDD power potential and the VSS power potential, or is supplied with the VDD power potential and the VVSS power potential.

The semiconductor device includes a first switch transistor 51, a second switch transistor 52, a third switch transistor 53, and a fourth switch transistor 54.

The first switch transistor 51 is, for example, a p-channel MOS transistor. For example, a control signal from the first driving buffer 41 is input to the gate of the first switch transistor 51. A source (a VDD connection section) of the first switch transistor 51 is connected to the VDD wiring, and a drain (a VVDD connection section) is connected to the VVDD wiring.

The second switch transistor 52 is, for example, a p-channel MOS transistor. For example, a control signal from the second driving buffer 42 is input to the gate of the second switch transistor 52. The second switch transistor 52 is inserted in the VDD wiring. A first terminal (the drain) 521 of the second switch transistor 52 is connected to the source of the first switch transistor 51. A first power supply pad 81 is connected to the first terminal 521 and the source of the first switch transistor 51. The first power supply pad 81 is externally supplied with the VDD power potential. A second power supply pad 82 is connected to a second terminal (the source) 522 of the second switch transistor 52. The second power supply pad 82 is externally supplied with the VDD power potential.

The third switch transistor 53 is, for example, an n-channel MOS transistor. For example, a control signal from the third driving buffer 43 is input to the gate of the third switch transistor 53. The source (a VSS connection section) of the third switch transistor 53 is connected to the VSS wiring and the drain (a VVSS connection section) is connected to the VVSS wiring.

The fourth switch transistor 54 is, for example, an n-channel MOS transistor. For example, a control signal from the fourth driving buffer 44 is input to the gate of the fourth switch transistor 54. The fourth switch transistor 54 is inserted in the VSS wiring. A first terminal (the drain) 541 of the fourth switch transistor 54 is connected to the source of the third switch transistor 53. A third power supply pad 83 is connected to the first terminal 541 and the source of the third switch transistor 53. The third power supply pad 83 is externally supplied with the VSS power potential. A fourth power supply pad 84 is connected to a second terminal (the source) 542 of the fourth switch transistor 54. The fourth power supply pad 84 is externally supplied with the VSS power potential.

The first to fourth driving buffers 41-44 are connected to a control circuit (not depicted), and operations of the first to fourth switch transistors 51-54 are controlled by the control circuit via the first to fourth driving buffers 41-44. For example, the control circuit is provided in the first power domain 31A, and the VDD power potential and the VSS power potential are applied to the control circuit. The control circuit turns on or turns off the first switch transistor 51 to control conduction between the VDD wiring and the VVDD wiring. The control circuit turns on or turns off the third switch transistor 53 to control conduction between the VSS wiring and the VVSS wiring. The control circuit turns on or turns off the second and fourth switch transistors 52 and 54 to control conduction between the first and second power domains 31A and 31B.

As will be described in detail later, the second wiring layer 22 includes a first sub-wiring layer 201 and a second sub-wiring layer 202. The first sub-wiring layer 201 is located on the first chip 10 side of the second sub-wiring layer 202. In a first embodiment, the first to fourth switch transistors 51-54 are provided in the second sub-wiring layer 202.

The first to fourth switch transistors 51-54 may be thin film transistors (TFTs) or may be micro electro mechanical systems (MEMS) switches.

[First to Fourth Driving Buffers 41-44]

Figure 4:
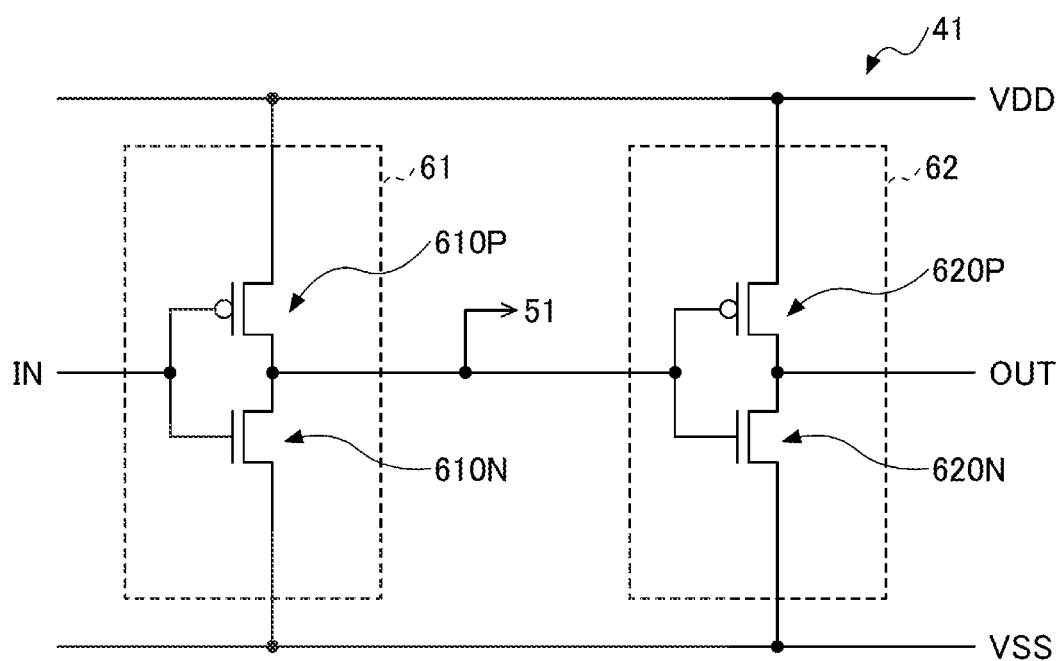
FIG. 4 is a circuit diagram depicting a configuration of a driving buffer.
Figure 5:
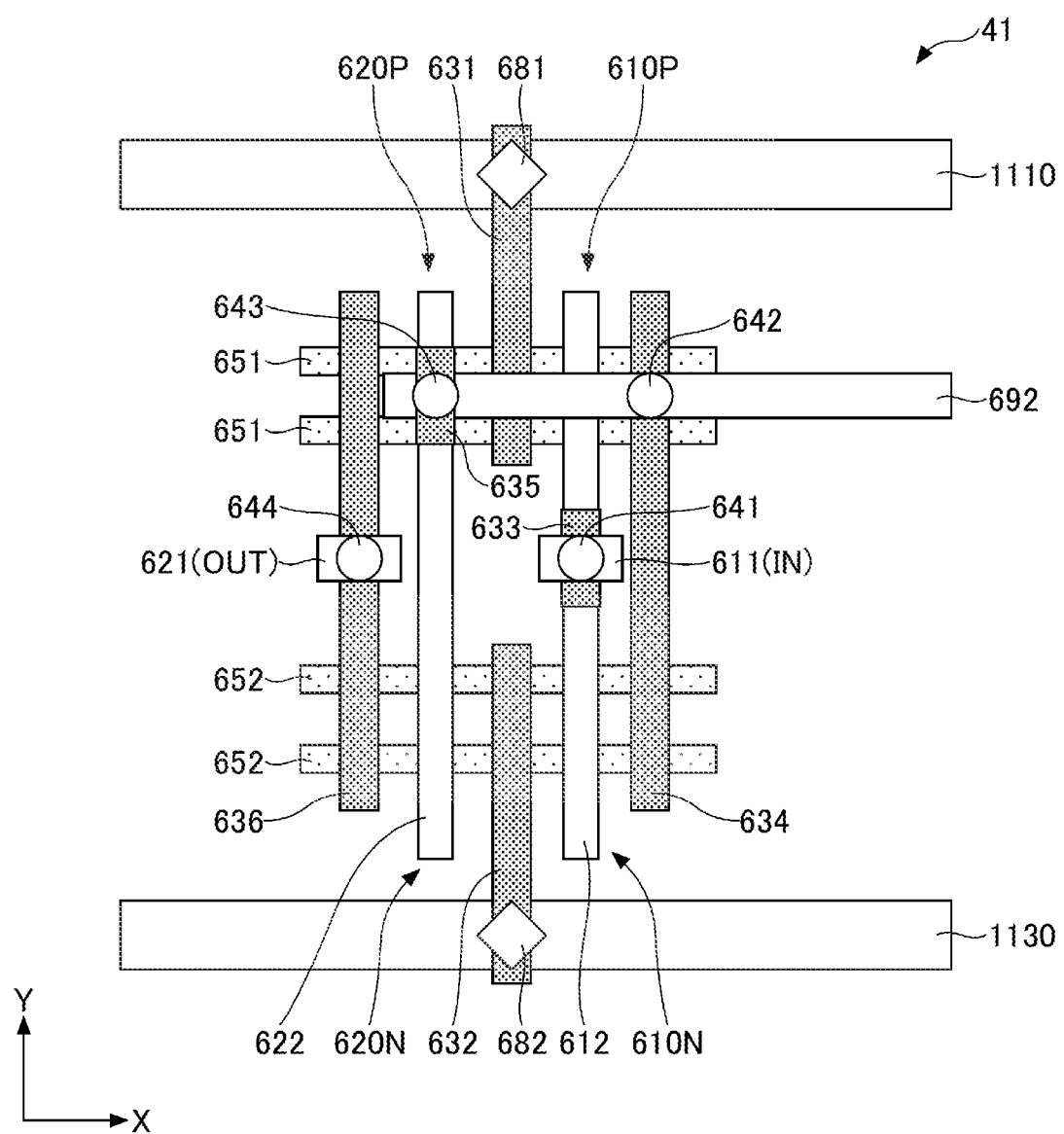
FIG. 5 is a schematic view depicting a configuration of an example of the driving buffer in plan view.

Next, configurations of the first to fourth driving buffers 41 to 44 will be described. FIG. 4 is a circuit diagram depicting a configuration of the first driving buffer 41. FIG. 5 is a schematic view depicting an exemplary configuration of the first driving buffer 41 in plan view.

As depicted in FIG. 4, the first driving buffer 41 includes an inverter 61 and an inverter 62. An input signal IN is input to the inverter 61, an output signal of the inverter 61 is input to the inverter 62, and an output signal OUT is output from the inverter 62. The inverter 61 includes a p-channel MOS transistor 610P and an n-channel MOS transistor 610N. The inverter 62 includes a p-channel MOS transistor 620P and an n-channel MOS transistor 620N.

In one example depicted in FIG. 5, for example, a power line 1110 corresponding to a VDD wiring and a power line 1130 corresponding to a VSS wiring are provided. The power lines 1110 and 1130 extend in the X-direction. Semiconductor fins 651 extending in the X-direction are provided on the power line 1130 side of the power line 1110. The two fins 651 are provided, for example. Semiconductor fins 652 extending in the X-direction are provided on the power line 1130 side of the fins 651. The two fins 652 are provided, for example. A local wiring 631 is provided which extends in the Y-direction, is connected to the fins 651, and is connected to the power line 1110 via a via 681. A local wiring 632 is provided which extends in the Y-direction, is connected to the fins 652, and is connected to the power line 1130 via a via 682. A local wiring 634 is provided in the [positive] X-direction with respect to the local wirings 631 and 632, and is connected to the fins 651 and 652. A local wiring 636 is provided in the direction opposite to the [positive]X-direction with respect to the local wirings 631 and 632, and is connected to the fins 651 and 652.

A gate electrode 612 is provided intersecting the fins 651 and 652 via a gate insulating film (not depicted) between the local wiring 631 and the local wiring 634 and between the local wiring 632 and the local wiring 634. A gate electrode 622 is provided intersecting the fins 651 and 652 via a gate insulating film (not depicted) between the local wiring 631 and the local wiring 636 and between the local wiring 632 and the local wiring 636. The gate electrode 612 is connected to an wiring 611 via a local wiring 633 and a via 641. The gate electrode 622 is connected to an wiring 692 via a local wiring 635 and a via 643. The wiring 692 is also connected to the local wiring 634. The local wiring 636 is connected to an wiring 621 via a via 644. An input signal IN is input to the wiring 611 and an output signal OUT is output from the wiring 621 (see FIG. 4).

The wiring 692 may be connected to the gate of the first switch transistor 51. Instead of the wiring 692, either the wiring 611 or the wiring 621 may be connected to the gate of the first switch transistor 51. That is, an output of the inverter 61 may be input to the gate of the first switch transistor 51. Instead of the output of the inverter 61, either an input of the inverter 61 or an output of the inverter 62 may be connected to the gate of the first switch transistor 51.

The second to fourth driving buffers 42 to 44 may have configurations the same as or similar to that of the first driving buffer 41.

It should be noted that the configurations of the inverters 61 and 62 are exemplary. For example, the number of pairs of p-channel MOS transistors and N-channel MOS transistors included in each of the inverters 61 and 62 may be two or more.

[Standard Cell 56]

Figure 6:
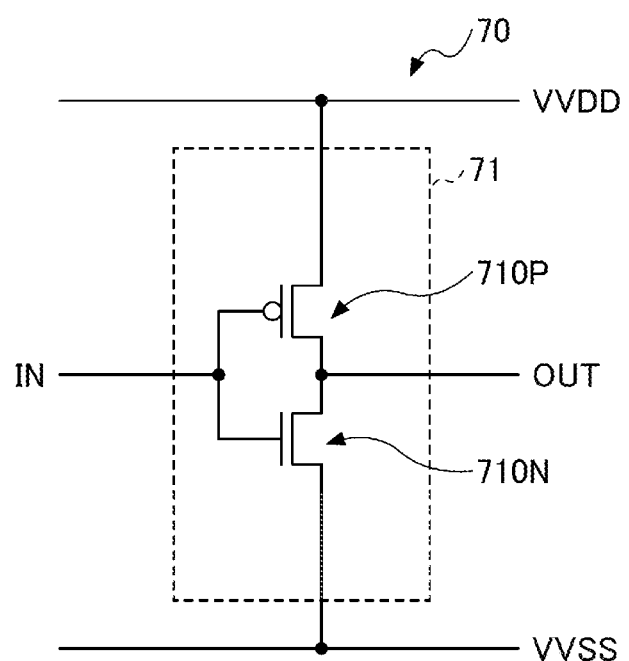
FIG. 6 is a circuit diagram depicting an inverter configuration.
Figure 7:
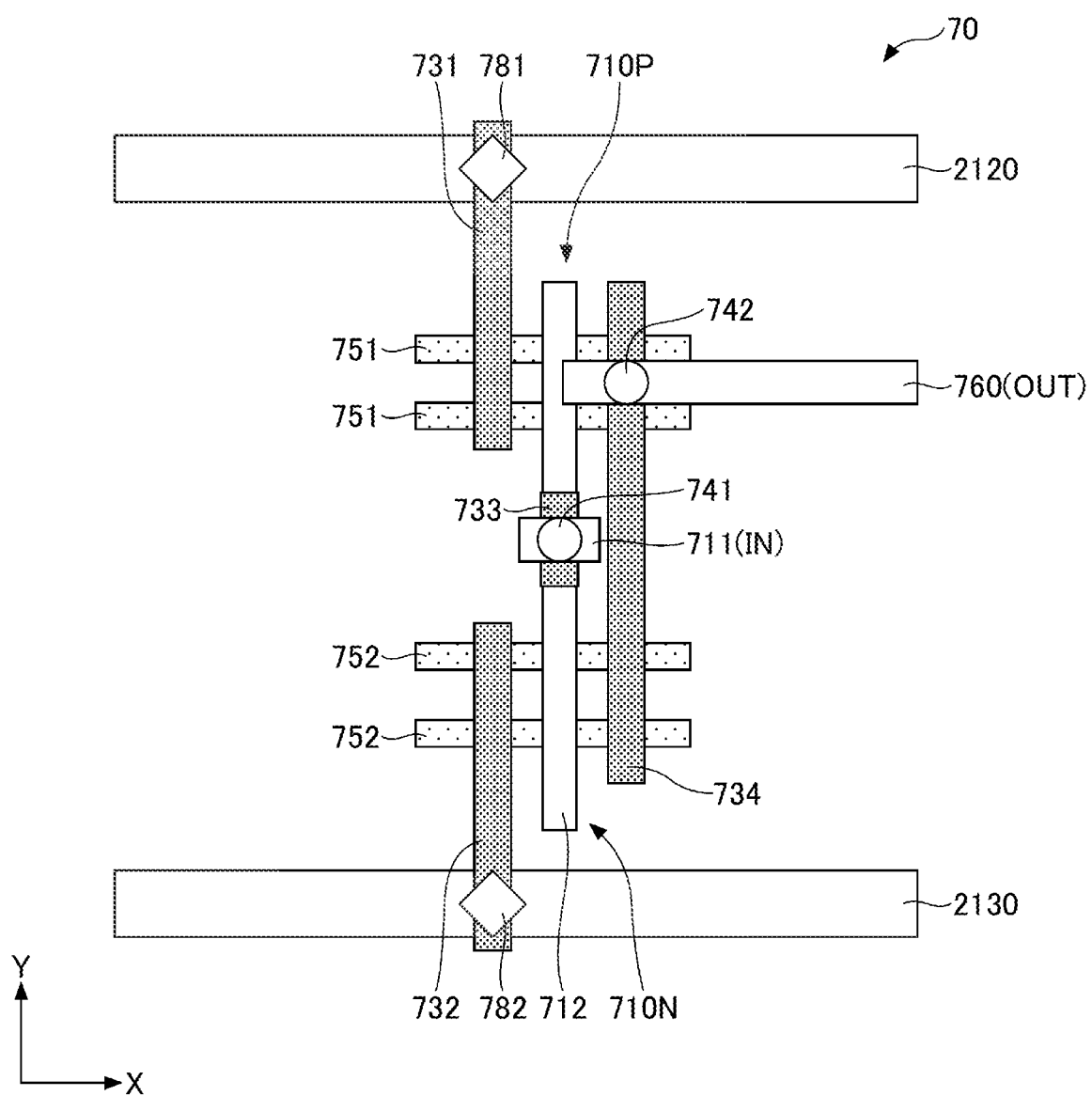
FIG. 7 is a schematic view depicting a configuration of the inverter in plan view.

Next, the configuration of an inverter as an example of a circuit included in the standard cell 56 will be described. FIG. 6 is a circuit diagram depicting an inverter configuration. FIG. 7 is a schematic view depicting a configuration of the inverter in plan view.

As depicted in FIG. 6, the inverter 70 includes a p-channel MOS transistor 710P and an n-channel MOS transistor 710N.

For example, as depicted in FIG. 7, a power line 2120 corresponding to a VVDD wiring and a power line 2130 corresponding to a VVSS wiring are provided. The power lines 2120 and 2130 extend in the X-direction. Semiconductor fins 751 extending in the X-direction are provided on the power line 2130 side of the power line 2120. Two fins 751 are provided, for example. Semiconductor fins 752 extending in the X-direction are provided on the power line 2130 side of the fins 751. The two fins 752 are provided, for example. A local wiring 731 is provided that extends in the Y-direction, is connected to the fins 751, and is connected to the power line 2120 via a via 781. A local wiring 732 is provided that extends in the Y-direction, is connected to the fins 752, and is connected to the power line 2130 via a via 782. A local wiring 734 is provided in the X-direction with respect to the local wirings 731 and 732, and is connected to the fins 751 and 752. The circuits may be provided throughout a region having three or more power lines 2120 and 2130. That is, the circuits may be a so-called multi-height circuit.

A gate electrode 712 is provided intersecting the fins 751 and 752 via a gate insulating film (not depicted) between the local wiring 731 and the local wiring 734 and between the local wiring 732 and the local wiring 734. The gate electrode 712 is connected to an wiring 711 via a local wiring 733 and a via 741. The local wiring 734 is connected to an wiring 760 via a via 742. An input signal IN is input to the wiring 711 and an output signal OUT is output from the wiring 760 (see FIG. 6).

Although FIGS. 5 and 7 depict fin-based transistors (FinFETs), a logic circuit such as a buffer may be provided with planar-type transistors, complementary field effect transistors (CFETs), transistors using nanowires, or the like.

At least one of the VVDD wiring or the VVSS wiring is needed to be provided. For example, if the VVDD wiring is provided, the VSS wiring may be provided instead of the VVSS wiring. In this case, the combination of the third driving buffer 43 and the third switch transistor 53 need not be provided. For example, if the VVSS wiring is provided, the VDD wiring may be provided instead of the VVDD wiring. In this case, the combination of the first driving buffer 41 and the first switch transistor 51 need not be provided.

Further, if either one of the combination of the second driving buffer 42 and the second switch transistor 52 or the combination of the fourth driving buffer 44 and the fourth switch transistor 54 is provided, the other one thereof need not be provided. For example, if the combination of the second driving buffer 42 and the second switch transistor 52 is provided, the combination of the fourth driving buffer 44 and the fourth switch transistor 54 need not be provided.

First Embodiment

Figure 8:
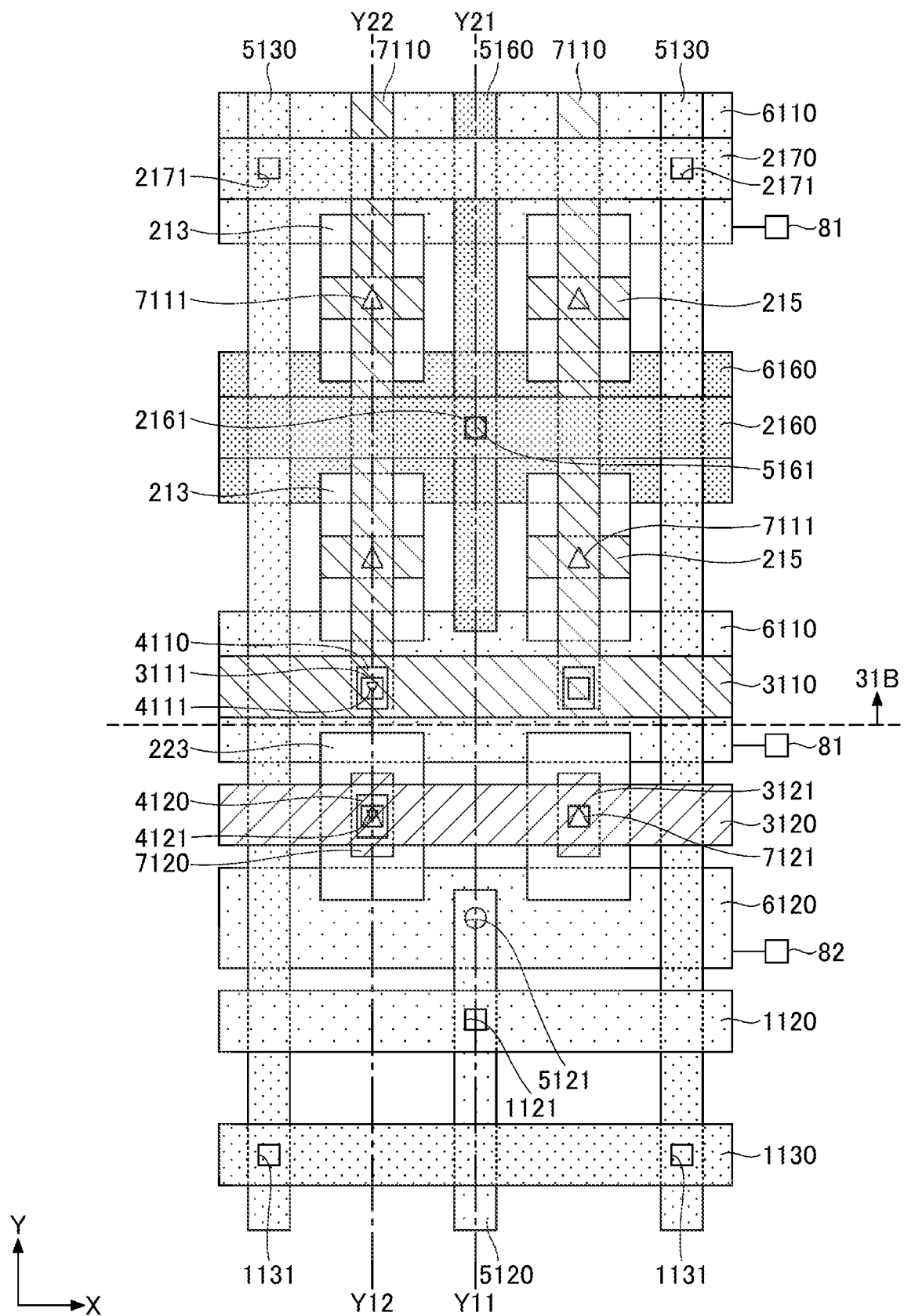
FIG. 8 is a schematic view depicting a configuration of a semiconductor device according to a first embodiment in plan view.
Figure 9:
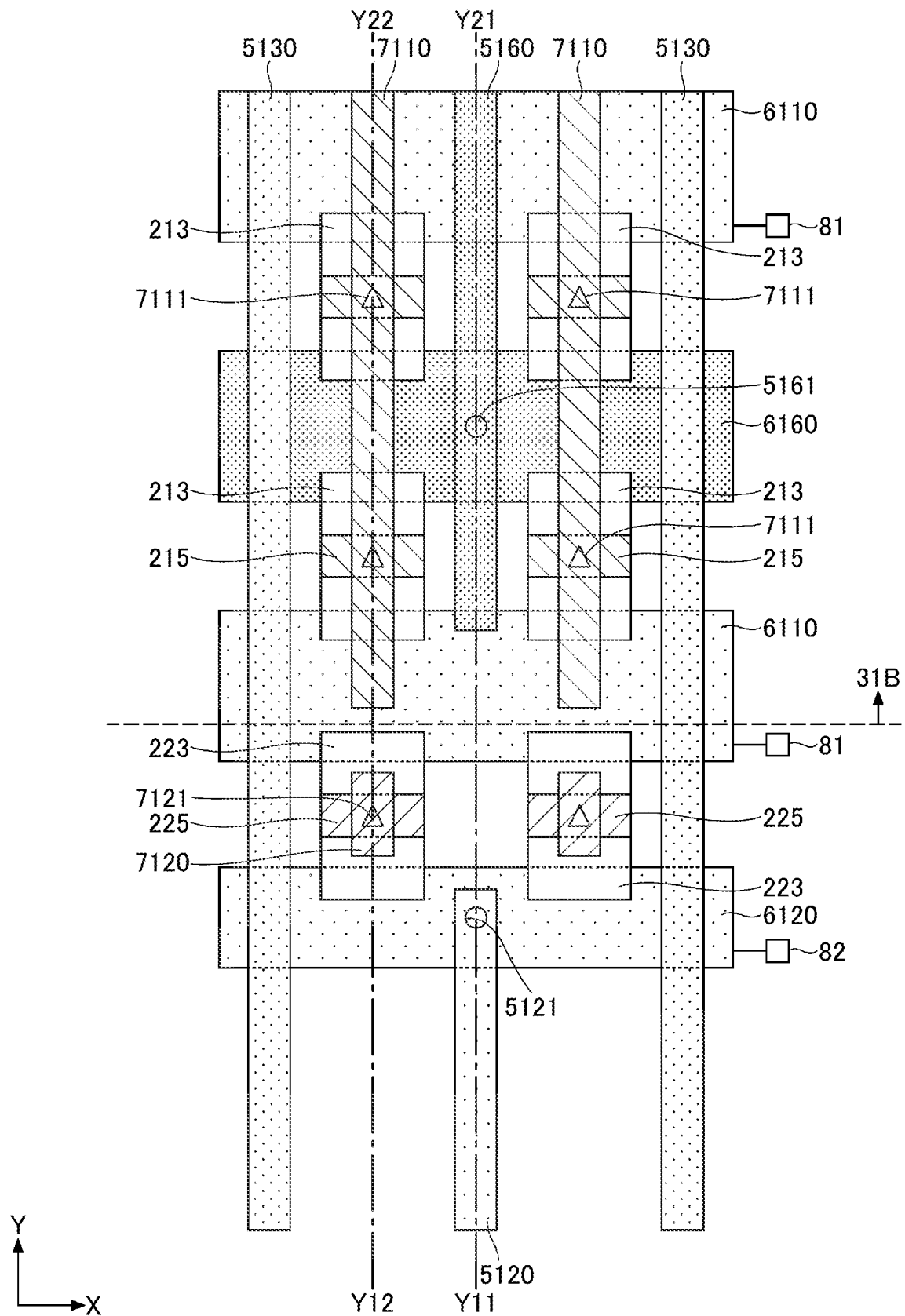
FIG. 9 is a schematic view depicting the configuration of the semiconductor device according to the first embodiment.

A first embodiment will now be described. In the first embodiment, among the elements of the circuit depicted in FIG. 3, the VVSS wiring, the third driving buffer 43, the third switch transistor 53, and the fourth switch transistor 54 are not provided. FIGS. 8 and 9 are schematic views depicting a configuration of a semiconductor device according to the first embodiment in plan view. FIGS. 10 and 11 are cross-sectional views depicting the semiconductor device according to the first embodiment. FIG. 8 depicts an internal configuration of the first chip 10 and the second chip 20, and FIG. 9 depicts an internal configuration of the second chip 20. FIG. 10 is the cross-sectional view taken along the Y11-Y21 line in FIGS. 8 and 9, and FIG. 11 is the cross-sectional view taken along the Y12-Y22 line in FIGS. 8 and 9.

[First Chip 10]

The first chip 10 includes a control signal line 3110 extending in the X-direction. In the example of FIG. 8, the first chip 10 includes a power line 2160 extending in the X-direction and a power line 2170 extending in the X-direction that are disposed in the [positive] Y-direction with respect to the control signal line 3110. In the example of FIG. 8, the power line 2160 is located on the control signal line 3110 side of the power line 2170. For example, the power line 2160 corresponds to a VVDD wiring and the power line 2170 corresponds to a VSS wiring. The control signal line 3110 is connected between the first driving buffer 41 and the gate of the first switch transistor 51. Plural pairs of power lines 2160 and 2170 may be arranged where the power lines 2160 and 2170 are alternately arranged. The power line 2160 and the power line 2170 are disposed in the second power domain 31B. Also the control signal line 3110 may be disposed in the second power domain 31B.

In the example of FIG. 8, the first chip 10 includes a control signal line 3120 extending in the X-direction, a power line 1120 extending in the X-direction, and a power line 1130 extending in the X-direction that are disposed in the direction opposite to the [positive] Y-direction with respect to the control signal line 3110. In the example of FIG. 8, the control signal line 3120 is located on the control signal line 3110 side of the power line 1120, and the power line 1120 is located on the control signal line 3110 side of the power line 1130. For example, the power line 1120 corresponds to a VDD wiring electrically connected to a second power supply pad 82, and the power line 1130 corresponds to a VSS wiring. The control signal line 3120 is connected between the second driving buffer 42 and the gate of the second switch transistor 52. The control signal line 3120, the power line 1120, and the power line 1130 are disposed outside of the second power domain 31B. The arrangement of the control signal lines and the power lines is not limited to the example depicted in FIG. 8, and may be changed as needed.

As depicted in FIGS. 10 and 11, a plurality of grooves extending in the X-direction are formed on the substrate 11, and the control signal line 3110, the power line 2160, the power line 2170, the control signal line 3120, the power line 1120, and the power line 1130 are formed in these grooves. The power line 2160, the power line 2170, the power line 1120, and the power line 1130 having such a configuration may be referred to as buried power rails (BPRs). A device isolation film (not depicted) may be formed on the surface of the substrate 11. The device isolation film is formed, for example, by a shallow trench isolation (STI) method. The surface of the device isolation film may be or need not be flush with the surface of the substrate 11.

In the second power domain 31B, a circuit, such as the standard cell 56, is connected between the power line 2160 and the power line 2170, although not depicted in FIGS. 8-11.

The first power domain 31A is disposed outside the second power domain 31B, and circuits such as the first driving buffer 41, the second driving buffer 42, control circuits therefor, and so forth are connected between the power line 1120 and the power line 1130 in the first power domain 31A, although not depicted in FIGS. 8-11.

The first wiring layer 12 includes control signal lines 4110 and 4120 that are disposed above the control signal line 3110, the power line 2160, the power line 2170, the control signal line 3120, the power line 1120, and the power line 1130. The first wiring layer 12 has a via 4111 formed therein to connect the control signal line 4110 and the control signal line 3110, and a via 4121 formed therein to connect the control signal line 4120 and the control signal line 3120. The via 4111 is formed under the control signal line 4110 and the via 4121 is formed under the control signal line 4120.

The substrate 11 has vias 1121, 1131, 2161, 2171, 3111, and 3121 formed therein to penetrate the substrate 11 to the back side thereof. The via 1121 is formed under the power line 1120, the vias 1131 are formed under the power line 1130, the via 2161 is formed under the power line 2160, and the vias 2171 are formed under the power line 2170. The vias 3111 are formed under the control signal line 3110 and the vias 3121 are formed under the control signal line 3120.

[Second Chip 20]

As depicted in FIGS. 10 and 11, the second chip 20 includes, for example, the insulating layer 25, the first sub-wiring layers 201 formed in a surface layer portion of the insulating layer 25, and the second sub-wiring layers 202 formed inside the insulating layer 25.

The first sub-wiring layers 201 include a power line 5120, power lines 5130, a power line 5160, control signal lines 7110, and control signal lines 7120. The power line 5120, the power lines 5130, the power line 5160, the control signal lines 7110, and the control signal lines 7120 extend in the Y-direction. For example, in a region overlapping the second power domain 31B in plan view, the power line 5160 is located between the two control signal lines 7110, and the control signal lines 7110 are located between the power lines 5130 and the power line 5160. For example, the power line 5130 is formed from a position under the power lines 2160 and 2170 to a position under the power line 1130. For example, the power line 5160 is formed in a region overlapping the second power domain 31B in plan view. For example, the power line 5120 is formed on an extension of the power line 5160 outside the region overlapping the second power domain 31B in plan view. For example, the power line 5120 corresponds to a VDD wiring electrically connected to the second power supply pad 82, the power lines 5130 correspond to VSS wirings, and the power line 5160 corresponds to a VVDD wiring.

The second sub-wiring layer 202 includes power lines 6110, a power line 6120, and a power line 6160. The power lines 6110, the power line 6120, and the power line 6160 extend in the X-direction. For example, the power line 6110 is located under the power line 2170, and the power line 6160 is located under the power line 2160. The power line 6120 has a portion overlapping the power line 5120 in plan view. The insulating layer 25 has a via 5121 formed therein to connect the power line 5120 and the power line 6120, and has a via 5161 formed therein to connect the power line 5160 and the power line 6160. For example, the power lines 6110 correspond to VDD wirings electrically connected to the first power supply pad 81, the power line 6120 corresponds to a VDD wiring electrically connected to the second power supply pad 82, and the power line 6160 corresponds to a VVDD wiring.

The insulating layer 25 is formed with a plurality of semiconductor layers 213 that overlap adjacent pairs of the power lines 6110 and 6160 in plan view in a region that overlap the second power domain 31B in plan view. The semiconductor layers 213 are connected to the power lines 6110 and 6160. Gate insulating films 214 are formed on the semiconductor layers 213, and gate electrodes 215 are formed on the gate insulating films 214. The gate insulating films 214 are in contact with the semiconductor layers 213 and the gate electrodes 215. The gate electrodes 215 are positioned in plan view between the power lines 6110 and the power line 6160. The insulating layer 25 has vias 7111 formed therein to connect the control signal lines 7110 and the corresponding gate electrodes 215. The semiconductor layers 213, the gate insulating films 214, and the gate electrodes 215 are included in the first switch transistors 51.

The insulating layer 25 has a plurality of semiconductor layers 223 formed therein that overlap in plan view an adjacent pair of the power lines 6110 and 6120. It should be noted that the semiconductor layers 223 may be disposed outside the region overlapping the second power domain 31B in plan view or may be disposed in the region overlapping the second power domain 31B in plan view. The semiconductor layers 223 are connected to the power lines 6110 and 6120. Gate insulating films 224 are formed on the semiconductor layers 223, and gate electrodes 225 are formed on the gate insulating films 224. The gate insulating films 224 are in contact with the semiconductor layers 223 and the gate electrodes 225. The gate electrodes 225 are positioned in plan view between the power line 6110 and the power line 6120. The insulating layer 25 has vias 7121 formed therein to connect the control signal lines 7120 and the corresponding gate electrodes 225. The semiconductor layers 223, the gate insulating films 224, and the gate electrodes 225 are included in the second switch transistors 52.

A plurality of pads 23 provided on the back side of the second chip 20 are used to supply external VDD power potential and VSS power potential. Signals after processing by the semiconductor device are output to the outside via a plurality of pads 23 provided on the back side of the second chip 20.

In the semiconductor device according to the first embodiment configured as described above, the first switch transistors 51 are turned off when there is no need to operate the standard cells 56. That is, control signals to avoid conduction between the power line 6110 and the power line 6160 are input to the gate electrodes 215. As a result, the power line 6160 (the VVDD wiring) is insulated from the first power supply pads 81 and the second power supply pad 82, and the supply of power potential from the power line 6110 (VDD wiring) to the power line 6160 (VVDD wiring) is interrupted.

When the standard cells 56 are to be operated, the first switch transistors 51 are turned on after the second switch transistors 52 are turned off. That is, control signals are input to the gate electrodes 225 to avoid conduction between the power line 6110 and the power line 6120, and then control signals are input to the gate electrodes 215 to allow conduction between the power lines 6110 and the power line 6160. As a result, under the condition that the power line 6120 (VDD wiring) is insulated from the power lines 6110 (VDD wiring), the power line 6160 (VVDD wiring) is electrically connected to the first power supply pads 81 via the power lines 6110 (VDD wiring), and thus, the VDD power potential is applied to the power line 6160 (VVDD wiring).

When the VDD power potential is applied to the power line 6160 (VVDD wiring), the standard cells 56 start operating. At this time, when also the second switch transistors 52 were in the turned-on states, the VDD power potential would be also supplied from the second power supply pad 82 to the second power domain 31B, and noise would be generated due to a sharp supply of the power potential, which would be transmitted to the first power domain 31A. This sharp supply of power potential is sometimes referred to as a rush current. In contrast, in the present embodiment, because the second switch transistors 52 are in the turned-off states, the rush current is reduced, and the generation of noise is reduced.

The second switch transistors 52 are turned on when fluctuations in the VDD power potential supplied to the second power domain 31B have subsided after the standard cells 56 have started operating. That is, the gate electrodes 225 receive control signals that allow conduction between the power line 6110 and the power line 6120. As a result, a stable VDD power potential is supplied to the first and second power domains 31A and 31B.

Thus, according to the present embodiment, an influence of noise associated with a rush current on a domain that is currently operating can be reduced.

(First Variant of First Embodiment)

Figure 12:
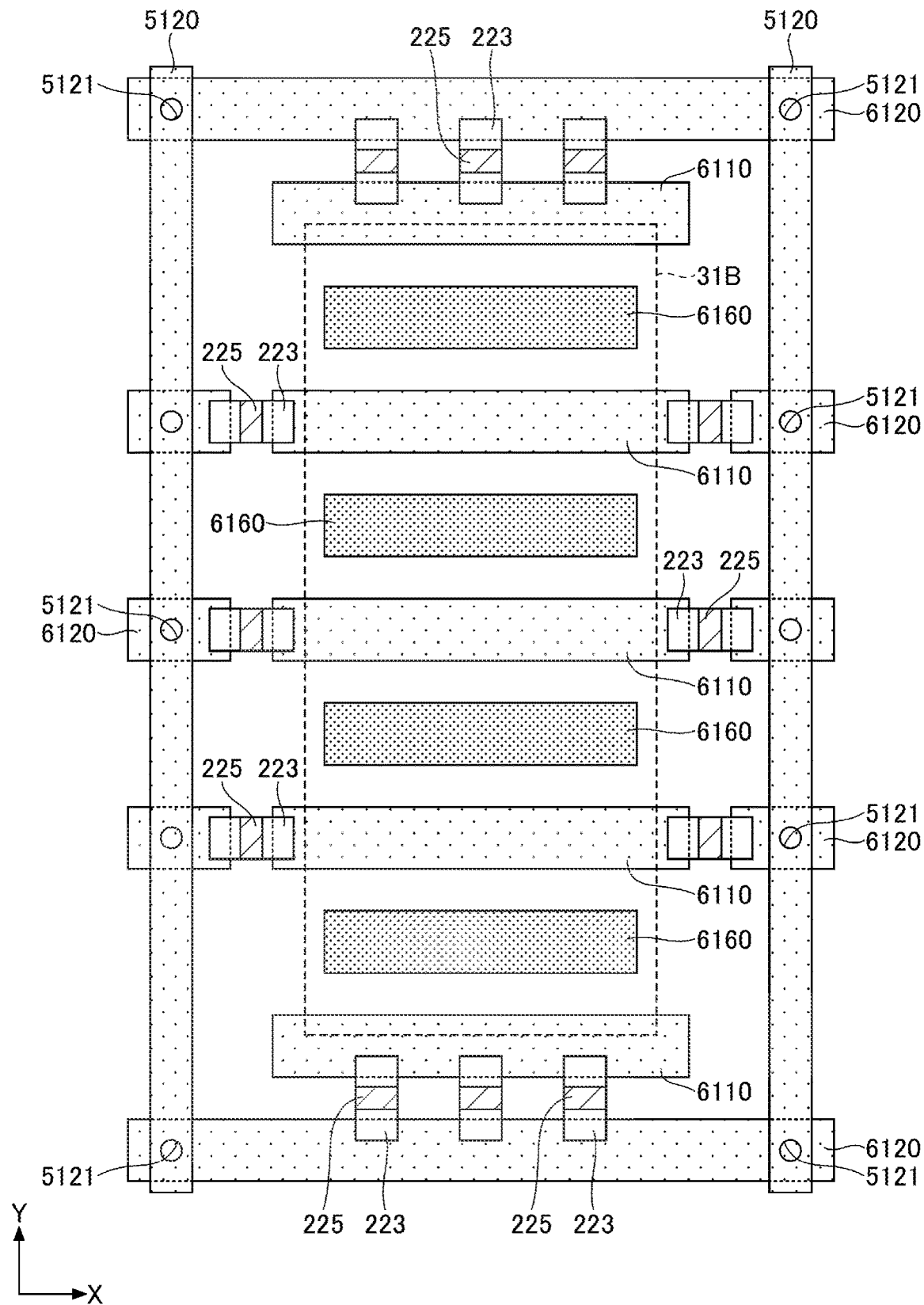
FIG. 12 is a schematic view depicting a configuration of a semiconductor device according to a first variant of the first embodiment in plan view.

Next, a first variant of the first embodiment will be described. The first variant is different from the first embodiment mainly in the layout of the second switch transistors. FIG. 12 is a schematic view depicting a configuration of a semiconductor device according to the first variant of the first embodiment. FIG. 12 depicts mainly the portions that differ from the first embodiment, and the other portions are omitted from FIG. 12.

As depicted in FIG. 12, in the first variant, the power lines 6120 extending in the X-direction are disposed in both the Y-direction and the direction opposite to the Y-direction with respect to the second power domain 31B in plan view. A plurality of the semiconductor layers 223 that overlap pairs of power lines 6110 and 6120 adjacent in the Y-direction are formed outside the region that overlaps the second power domain 31B in plan view. The gate insulating films 224 (see FIG. 11) and the gate electrodes 225 are formed on the semiconductor layers 223. The semiconductor layers 223, the gate insulating films 224, and the gate electrodes 225 are included in the second switch transistors 52.

The plurality of power lines 6110 extending in the X-direction are disposed in the region overlapping the second power domain 31B in plan view. The power lines 6120 extending in the X-direction are disposed on extensions of the power lines 6110 both in the X-direction and in the direction opposite to the X-direction with respect to the second power domain 31B in plan view. A plurality of the semiconductor layers 223 that overlap pairs of power lines 6110 and 6120 adjacent in the X-direction are formed outside the region overlapping the second power domain 31B in plan view. The gate insulating films 224 (see FIG. 11) and the gate electrodes 225 are formed on the semiconductor layers 223. The semiconductor layers 223, the gate insulating films 224, and the gate electrodes 225 are included in the second switch transistors 52.

The power lines 5120 extending in the Y-direction are disposed both in the X-direction and in the direction opposite to the X-direction with respect to the second power domain 31B in plan view. The power lines 5120 intersect the plurality of power lines 6120 at right angles in plan view; and the power lines 5120 and the power lines 6120 that intersect the power lines 5120 at right angles are connected via the vias 5121.

With respect to the second switch transistors 52 of FIG. 12, the vias 7121, the control signal lines 7120, and so forth are not depicted. That is, for the respective second switch transistors 52, the vias 7121 and the control signal lines 7120 are disposed. Although not depicted in FIG. 12, the first switch transistors 51 are connected between the power lines 6110 and the power lines 6160 that are adjacent in the Y-direction.

The other configurations are the same as or similar to those of the first embodiment.

Also the first variant has the same advantageous effects as those of the first embodiment.

The second switch transistors 52 need not be disposed in all of the X-direction, the direction opposite to the X-direction, the Y-direction, and the direction opposite to the Y-direction with respect to the second power domain 31B. For example, the second switch transistors 52 may be disposed only in the X-direction and in the direction opposite to the X-direction with respect to the second power domain 31B. The second switch transistors 52 may be disposed only in the Y-direction and in the direction opposite to the Y-direction with respect to the second power domain 31B.

Portions of the power lines 6110 and 6120 need not be directly connected to the second switch transistors 52 or may be connected to the second switch transistors 52 via other wirings.

(Second Variant of First Embodiment)

Figure 13:
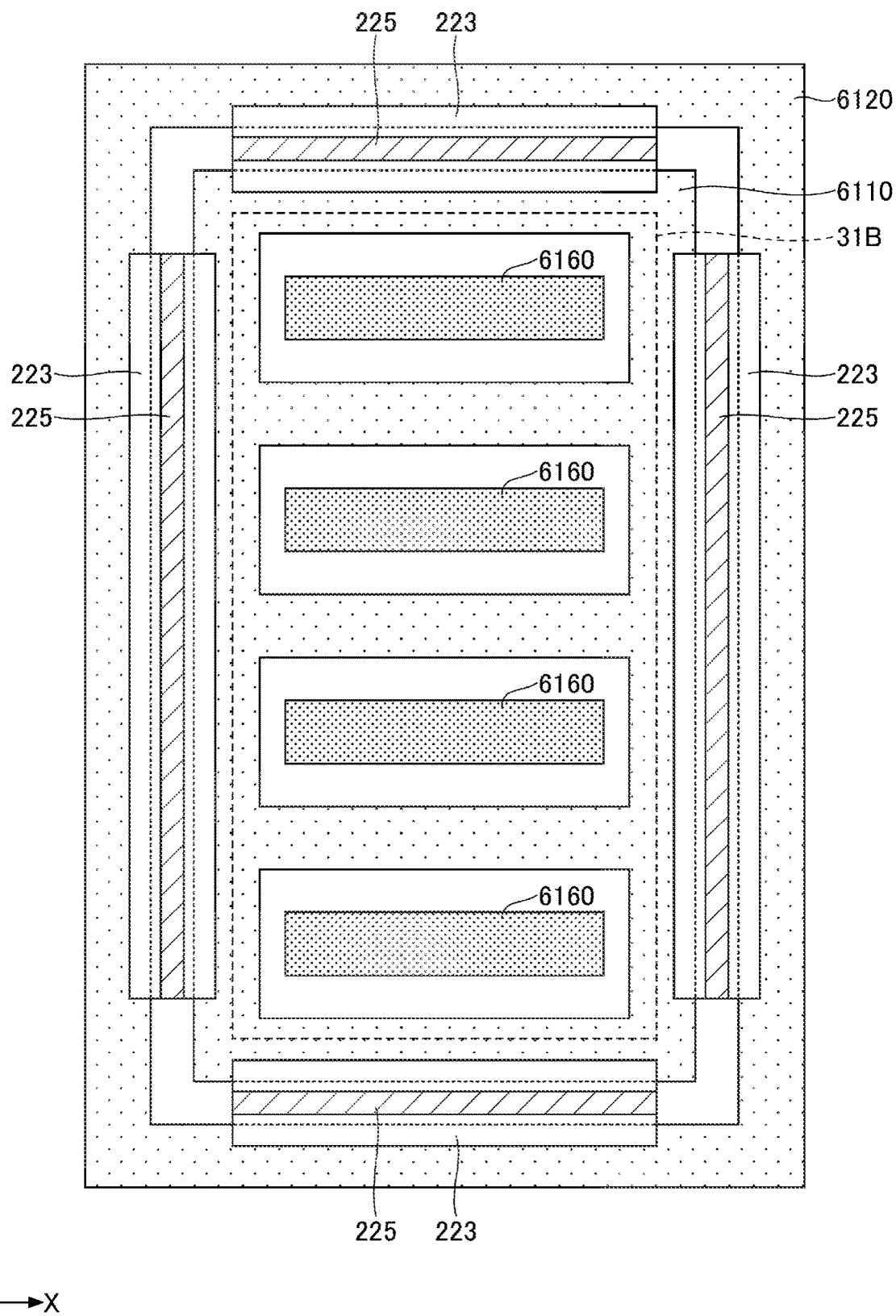
FIG. 13 is a schematic view depicting a configuration of a semiconductor device according to a second variant of the first embodiment in plan view.

Next, a second variant of the first embodiment will be described. The second variant is different from the first embodiment mainly in the layout of the second switch transistors. FIG. 13 is a schematic view depicting a configuration of a semiconductor device according to the second variant of the first embodiment. FIG. 13 depicts mainly portions that differ from the first embodiment, and the other portions are omitted from FIG. 13.

As depicted in FIG. 13, in the second variant, the ends of the plurality of power lines 6110 in the X-direction in the first variant are connected to each other, and the ends of the plurality of power lines 6110 in the direction opposite to the X-direction in the first variant are connected to each other. That is, the power lines 6110 have a ladder-like shape in plan view. The power lines 6110 have, in plan view, a loop-shaped portion and portions extending in the X-direction inside the loop-shaped portion and connected to the loop-shaped portion. Disposed outside of the loop-shaped portion of the power lines 6110 is a loop-shaped power line 6120 that has a loop shape in plan view.

The semiconductor layers 223 that overlap pairs of portions of the power lines 6110 and portions of the power lines 6120 adjacent in the Y-direction extend in the X-direction. The gate insulating films 224 (see FIG. 11) and the gate electrodes 225 extending in the X-direction are formed on the semiconductor layers 223. The semiconductor layers 223, the gate insulating films 224, and the gate electrodes 225 are included in the second switch transistors 52.

The semiconductor layers 223 that overlap pairs of portions of the power lines 6110 and portions of 6120 adjacent in the X-direction extend in the Y-direction. The gate insulating films 224 (see FIG. 11) and the gate electrodes 225 extending in the Y-direction are formed on the semiconductor layers 223. The semiconductor layers 223, the gate insulating films 224, and the gate electrodes 225 are included in the second switch transistors 52.

With respect to the second switch transistors 52 of FIG. 13, the vias 7121, the control signal lines 7120, and the like are not depicted. That is, for the respective second switch transistors 52, the vias 7121, the control signal lines 7120, and the like are disposed. Although not depicted in FIG. 13, the first switch transistors 51 are connected between the power lines 6110 and the power lines 6160 adjacent in the Y-direction.

The other configurations are the same as or similar to those of the first embodiment.

Also the second variant can obtain the same advantageous effects as those of the first embodiment.

The semiconductor layers 223 extending in the X-direction and the semiconductor layers 223 extending in the Y-direction may be disposed with the power lines 6110 not including the loop-shaped portion but including portions extending in the X-direction and portions extending in the Y-direction. The semiconductors layers 223 extending in the X-direction and the semiconductor layers 223 extending in the Y-direction may be disposed with the power lines 6120 not including the loop shape in plan view but including portions extending in the X-direction and portions extending in the Y-direction.

The semiconductor layers 213, the gate insulating films 214, and the gate electrodes 215 included in the first switch transistors 51 may extend in the X-direction.

(Third Variant of First Embodiment)

Figure 14:
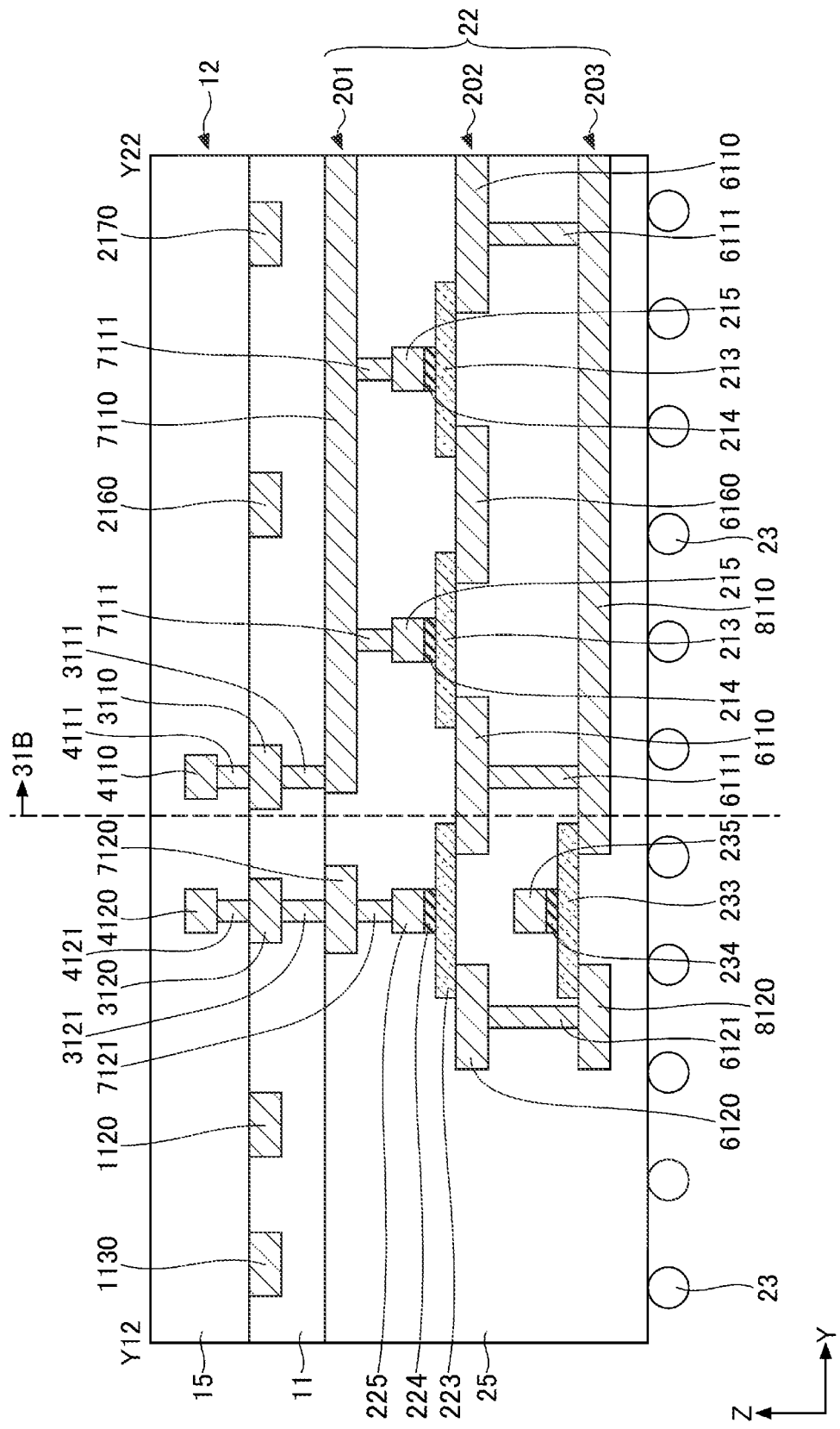
FIG. 14 is a cross-sectional view depicting a semiconductor device according to a third variant of the first embodiment.

Next, a third variant of the first embodiment will be described. The third variant differs from the first embodiment mainly in the configuration of the second wiring layer 22. FIG. 14 is a cross-sectional view depicting a semiconductor device according to the third variant of the first embodiment. FIG. 14 depicts, mainly, portions that differ from the first embodiment, and the other portions are omitted from FIG. 14.

As depicted in FIG. 14, in the third variant, the second wiring layer 22 further includes a third sub-wiring layer 203 below the second sub-wiring layer 202. That is, the third sub-wiring layer 203 is formed more distant from the first chip 10 than the second sub-wiring layer 202. The third sub-wiring layer 203 includes, for example, power lines 8110 and power lines 8120. The power lines 8110 and the power lines 8120 extend in the Y-direction. The power lines 8110 include portions overlapping power lines 6110 in plan view. The power lines 8120 include portions overlapping the power line 6120 in plan view. The insulating layer 25 has vias 6111 formed therein to connect the power lines 6110 and the power lines 8110, and vias 6121 formed therein to connect the power line 6120 and the power lines 8120. For example, the power lines 8110 correspond to VDD wirings electrically connected to the first power supply pads 81, and the power lines 8120 correspond to VDD wirings electrically connected to the second power supply pad 82.

The insulating layer 25 has a plurality of semiconductor layers 233 formed therein to overlap pairs of the power lines 8110 and 8120 adjacent to each other in plan view outside a region that overlaps the second power domain 31B. The semiconductor layers 233 are connected to the power lines 8110 and 8120. Gate insulating films 234 are formed on the semiconductor layers 233, and gate electrodes 235 are formed on the gate insulating films 234. The gate insulating films 234 are in contact with the semiconductor layers 233 and the gate electrodes 235. The gate electrodes 235 are positioned in plan view between the power lines 8110 and the power lines 8120. The insulating layer 25 has vias or the like (not depicted) formed therein to connect the control signal lines 7120 and the gate electrodes 235. The semiconductor layers 233, the gate insulating films 234, and the gate electrodes 235 are included in the second switch transistors 52.

The other configurations are the same as or similar to those of the first embodiment.

Also the third variant can obtain the same advantageous effects as those of the first embodiment. According to the third variant, the power potentials can be more stable.

The semiconductor layers 233, the gate insulating films 234, and the gate electrode 235 need not be provided.

(Fourth Variant of First Embodiment)

Figure 15:
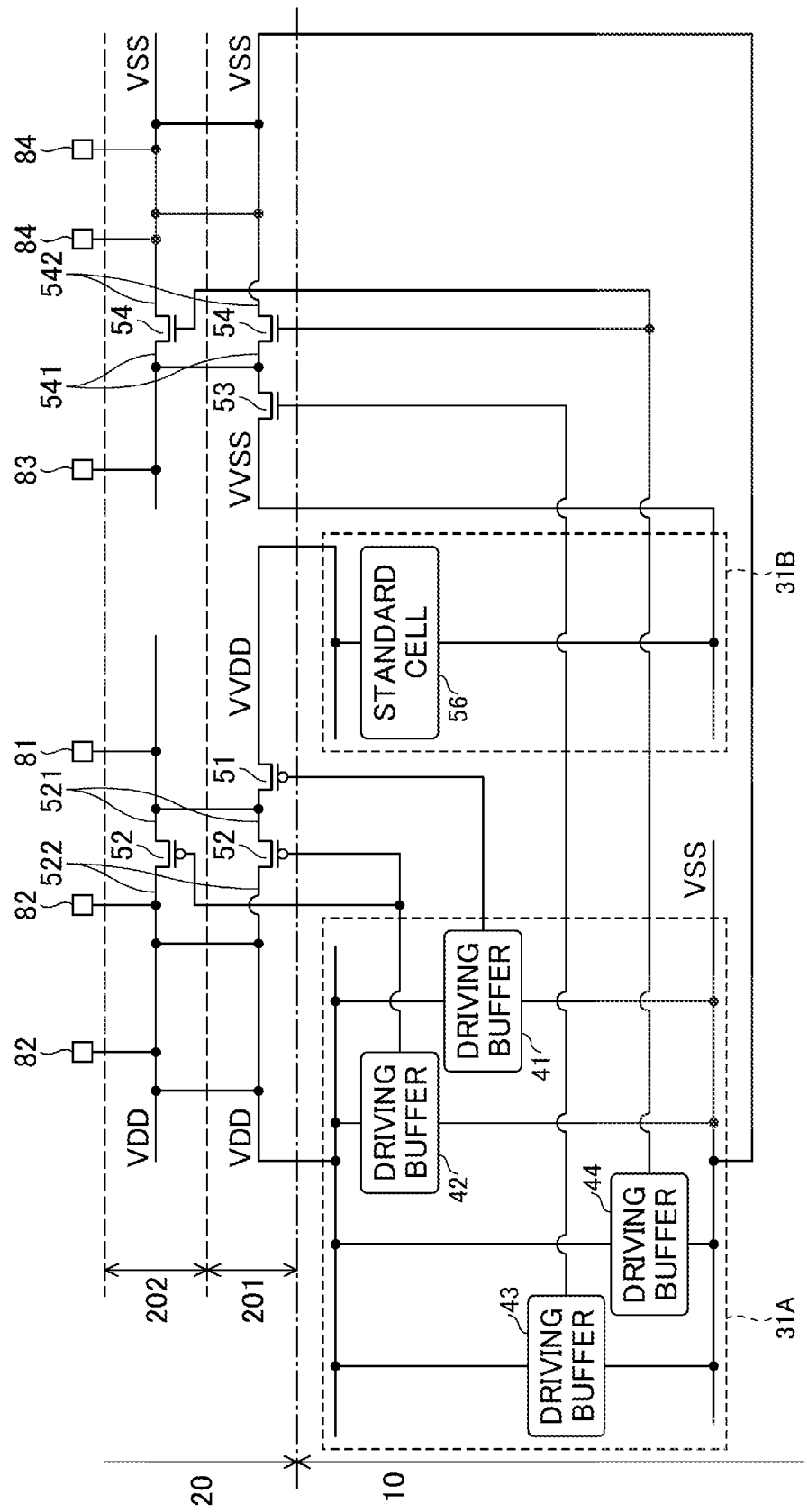
FIG. 15 is a circuit diagram depicting an example of a configuration of a circuit included in a semiconductor device according to a fourth variant of the first embodiment.

Next, a fourth variant of the first embodiment will be described. The fourth variant differs from the first embodiment mainly in the configuration of the second wiring layer 22. FIG. 15 is a circuit diagram depicting an example of a configuration of a circuit included in a semiconductor device according to the fourth variant of the first embodiment. FIG. 15 depicts, mainly portions that differ from the first embodiment, and the other portions are omitted from FIG. 15.

As depicted in FIG. 15, in the fourth variant, the second wiring layer 22 includes the first sub-wiring layer 201 and the second sub-wiring layer 202. The first switch transistor 51 and the third switch transistor 53 are disposed in the first sub-wiring layer 201. The second switch transistors 52 and the fourth switch transistors 54 are disposed in both the first sub-wiring layer 201 and the second sub-wiring layer 202.

The fourth variant with such a circuit configuration can have the same advantageous effects as those of the first embodiment.

(Fifth Variant of First Embodiment)

Figure 16:
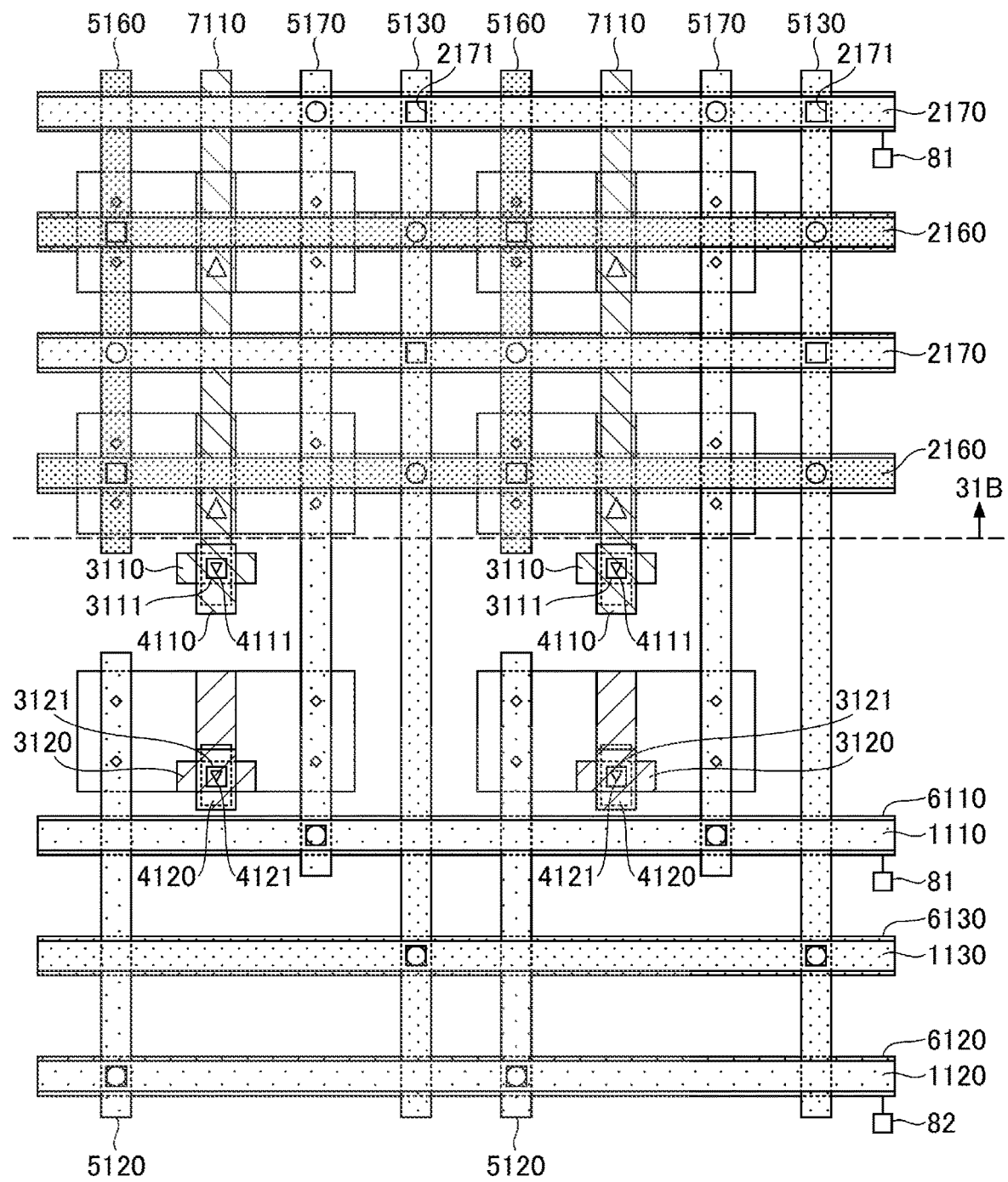
FIG. 16 is a schematic view depicting a configuration of a semiconductor device according to a fifth variant of the first embodiment in plan view.
Figure 17:
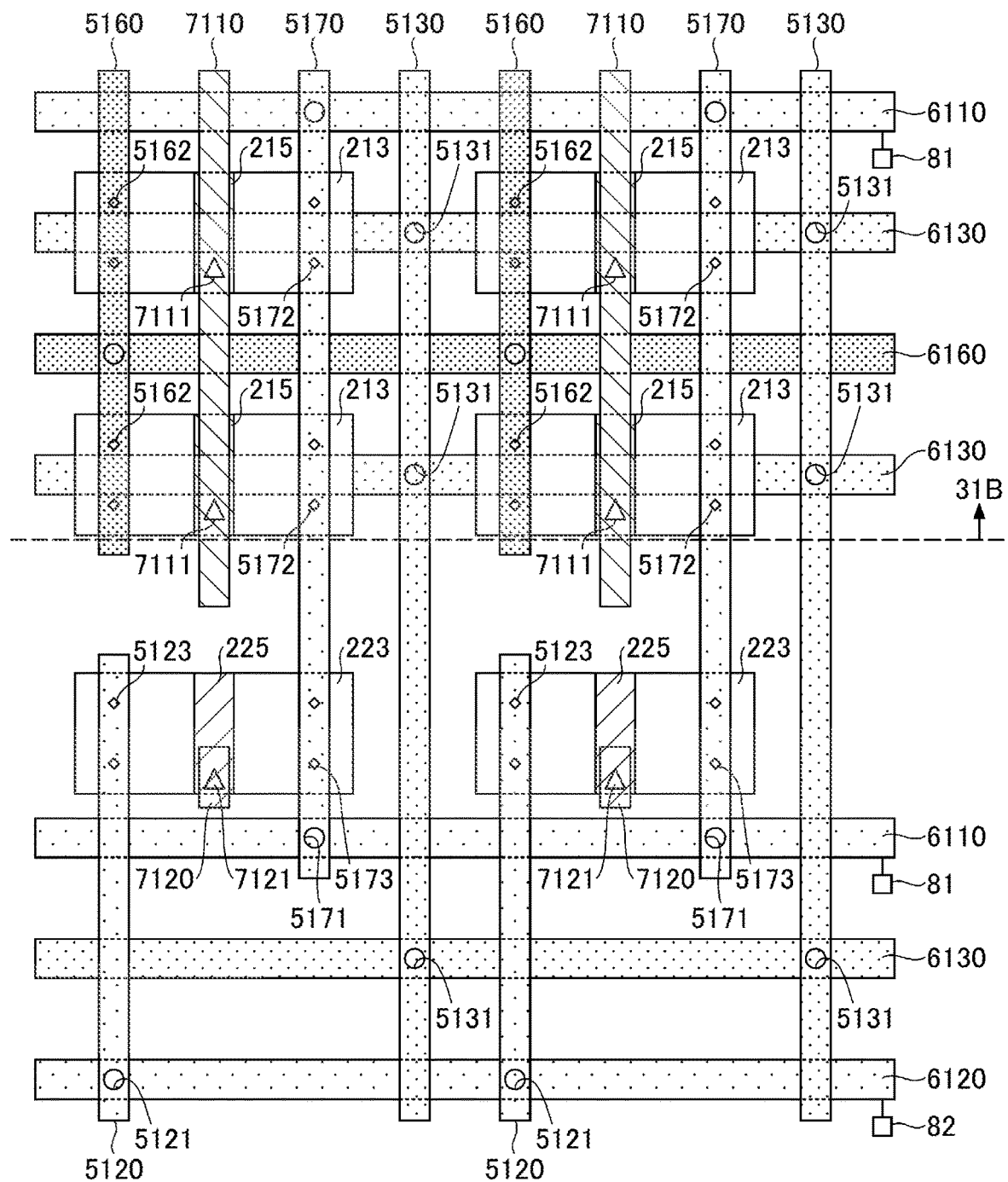
FIG. 17 is a schematic view depicting the configuration of the semiconductor device according to the fifth variant of the first embodiment in plan view.

Next, a fifth variant of the first embodiment will be described. The fifth variant differs from the first embodiment mainly in the configurations of the switch transistors. FIGS. 16 and 17 are schematic views depicting a configuration of a semiconductor device according to the fifth variant of the first embodiment. FIG. 16 depicts an internal configuration of the first chip 10 and the second chip 20, and FIG. 17 depicts an internal configuration of the second chip 20. FIGS. 16 and 17 depict mainly the portions that differ from the first embodiment, and the other portions are omitted from FIGS. 16 and 17.

As depicted in FIGS. 16 and 17, in the fifth variant, the second sub-wiring layer 202 includes power lines 6130 extending in the X-direction. For example, the power lines 6130 correspond to VSS wirings. The power lines 6130 intersect the power lines 5130 at right angles in plan view; the power lines 5130 are connected via vias 5131 with the power lines 6130 that intersect the power lines 5130 at right angles.

The first sub-wiring layer 201 includes power lines 5170 extending in the Y-direction. For example, the power lines 5170 correspond to VDD wirings electrically connected to the first power supply pads 81. For example, the power lines 5170 intersect the power lines 6110 at right angles; and the power lines 5170 are connected via vias 5171 with the power lines 6110 that intersect the power lines 5170 at right angles.

The control signal lines 7110 are disposed between the power lines 5160 and the power lines 5170 in a region overlapping the second power domain 31B in plan view. The semiconductor layers 213 are formed above the power lines 6130, and overlap the power lines 5160, the control signal lines 7110, and the power lines 5170 in plan view. The gate insulating films 214 (see FIG. 11) and the gate electrodes 215 are formed on the semiconductor layers 213 under the control signal lines 7110. The gate electrodes 215 are connected to the control signal lines 7110 via the vias 7111. The semiconductor layers 213 are connected to the power lines 5160 via vias 5162 at positions in a direction opposite to the X-direction with respect to the gate electrodes 215, and are connected to the power lines 5170 via vias 5172 at positions in the X-direction with respect to the gate electrodes 215. The vias 5162 are formed under the power lines 5160 and the vias 5172 are formed under the power lines 5170.

The control signal lines 7120 are disposed between the power lines 5120 and the power lines 5170 outside the region overlapping the second power domain 31B in plan view. The semiconductor layers 223 are formed overlapping the power lines 5120, the control signal lines 7120, and the power lines 5170 in plan view. The gate insulating films 224 (see FIG. 11) and the gate electrodes 225 are formed on the semiconductor layers 223 under the control signal lines 7120. The gate electrodes 225 are connected to the control signal lines 7120 via the vias 7121. The semiconductor layers 223 are connected to the power lines 5120 via vias 5123 at positions in a direction opposite to the X-direction with respect to the gate electrodes 225, and are connected to the power lines 5170 via vias 5173 at positions in the X-direction with respect to the gate electrodes 225. The vias 5123 are formed under the power lines 5120, and the vias 5173 are formed under the power lines 5170.

The other configurations are the same as or similar to those of the first embodiment.

The fifth variant can have the same advantageous effects as those of the first embodiment.

Also the configuration of the first variant in plan view (see FIG. 12) or the configuration of the second variant in plan view (see FIG. 13) may be used. The first switch transistor 51 and the second switch transistor 52 may be formed also in the second sub-wiring layer 202.

(Sixth Variant of First Embodiment)

Figure 18:
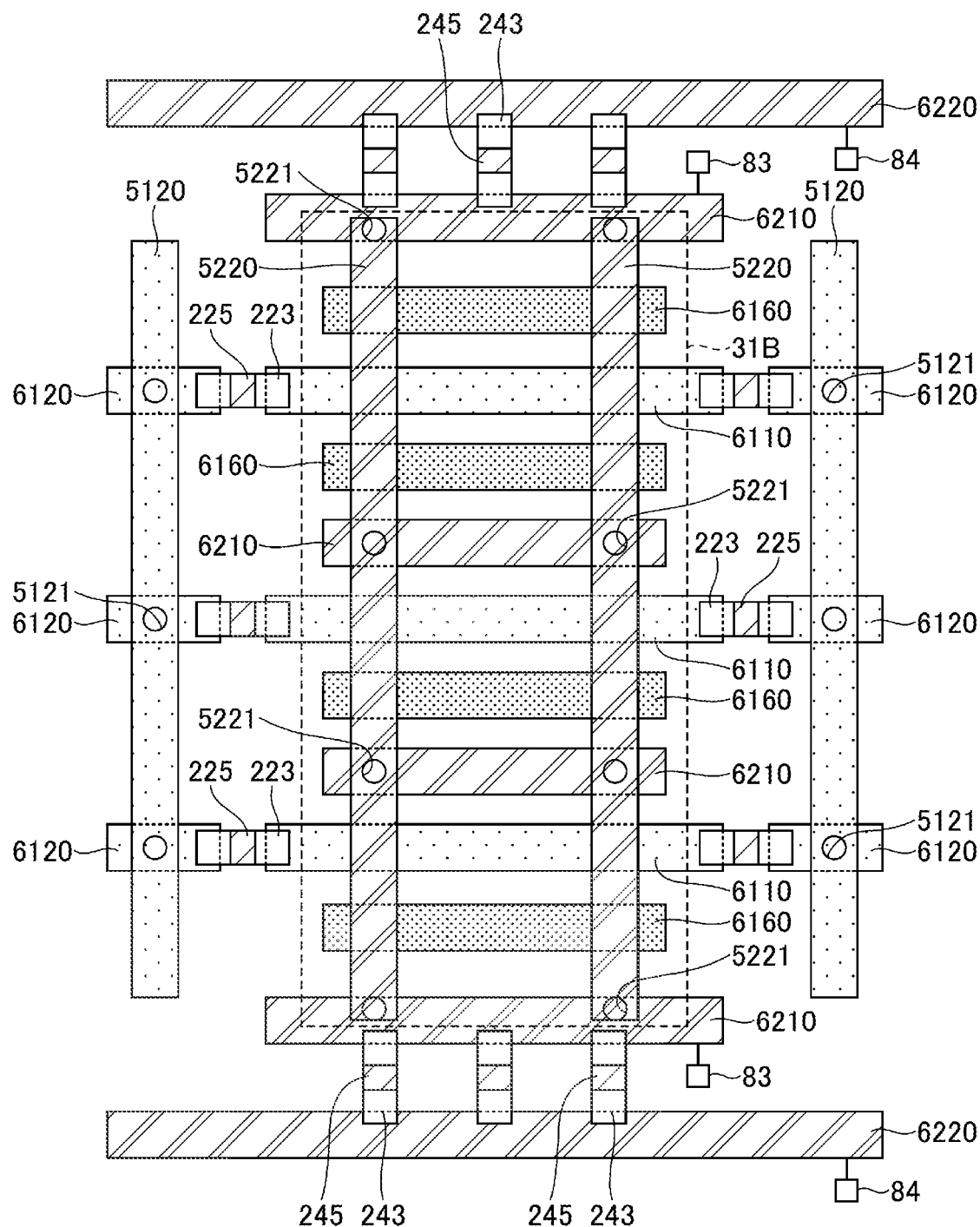
FIG. 18 is a schematic view depicting a configuration of a semiconductor device according to a sixth variant of the first embodiment in plan view.

Next, a sixth variant of the first embodiment will be described. The sixth variant differs from the first embodiment mainly in that the sixth variant includes fourth switch transistors. FIG. 18 is a schematic view depicting a configuration of a semiconductor device according to the sixth variant of the first embodiment in plan view. FIG. 18 depicts, mainly, portions that differ from the first embodiment, and the other portions are omitted from FIG. 18.

The semiconductor device according to the sixth variant includes the fourth switch transistors 54 in addition to the first switch transistors 51 and the second switch transistors 52.

As depicted in FIG. 18, in the sixth variant, power lines 6220 extending in the X-direction are disposed at positions both in the Y-direction and in the direction opposite to the Y-direction with respect to the second power domain 31B in plan view. A plurality of power lines 6210 extending in the X-direction are disposed in a region overlapping the second power domain 31B in plan view. The power lines 6210 and 6220 are included in the second sub-wiring layer 202. For example, the power lines 6210 correspond to VSS wirings electrically connected to the third power supply pads 83, and the power lines 6220 correspond to VSS wirings electrically connected to the fourth power supply pads 84. A plurality of semiconductor layers 243 overlapping the pairs of power lines 6210 and 6220 adjacent in the Y-direction are formed outside the region overlapping the second power domain 31B in the plan view. The gate insulating films (not depicted) and the gate electrodes 245 are formed on the semiconductor layers 243. The semiconductor layers 243, the gate insulating films (not depicted), and the gate electrodes 245 are included in the fourth switch transistors 54.

The first sub-wiring layer 201 includes power lines 5220 extending in the Y-direction. For example, the power lines 5220 correspond to VSS wirings. The power lines 5220 intersect the plurality of power lines 6210 at right angles in plan view, and the power lines 5220 are connected via vias 5221 with the power lines 6210 that intersect the power lines 5220 at right angles.

With respect to the second switch transistors 52 of FIG. 18, the vias 7121 and the control signal lines 7120 are omitted from FIG. 18. That is, for the respective second switch transistors 52, the vias 7121 and the control signal lines 7120 are disposed. With respect to the fourth switch transistors 54 of FIG. 18, the vias and the control signal lines connected to the gate electrodes 245, and the like are omitted from FIG. 18. That is, for the respective fourth switch transistors 54, the vias, the control signal lines, and the like are disposed. Although not depicted in FIG. 18, the first switch transistors 51 are connected between the power lines 6110 and the power lines 6160 adjacent in the Y-direction.

The other configurations are similar to those of the first embodiment.

In the semiconductor device according to the sixth variant configured in this manner, the first switch transistors 51 are turned off when there is no need to operate the standard cells 56. As a result, the power lines 6160 (VVDD wiring) are isolated from the first power supply pads 81 and the second power supply pads 82, and the supply of power potential from the power lines 6110 (VDD wiring) to the power lines 6160 (VVDD wiring) is interrupted (see FIGS. 8-11).

When the standard cells 56 are to be operated, the second switch transistors 52 and the fourth switch transistors 54 are turned off, and thereafter, the first switch transistors 51 are turned on. That is, control signals to avoid conduction between the power lines 6110 and the power lines 6120 are input to the gate electrodes 225, and control signals to avoid conduction between the power lines 6210 and the powers line 6220 are input to the gate electrodes 245. Thereafter, control signals to allow conduction between the power lines 6110 and the power lines 6160 are input to the gate electrodes 215. Thus, the VDD power potential is supplied to the power lines 6160 (VVDD wirings) under the condition that the power lines 6120 (VDD wirings) are insulated from the power lines 6110 (VDD wirings) and the power lines 6220 (VSS wirings) are insulated from the power lines 6210 (VSS wirings).

When the VDD power potential is applied to the power lines 6160 (VVDD wirings), the standard cells 56 start operating. At this time, if both the second switch transistors 52 and the fourth switch transistors 54 were turned on, the VDD power potential would be supplied also from the second power supply pads 82 to the second power domain 31B, and noise might be generated due to a sharp supply of the power potential, and the noise might be transmitted to the first power domain 31A. Such a sharp supply of power potential is sometimes called a rush current. In contrast thereto, in the present embodiment, because both the second switch transistors 52 and the fourth switch transistors 54 are in the turned-off states, the influence of a rush current on a domain which is currently operating can be reduced. Because the second switch transistors 52 and the fourth switch transistors 54 are thus in the turned-off states, noise generation can be reduced more than in a case where only the second or fourth switch transistors 52 or 54 are in the turned-off states.

The second switch transistors 52 and the fourth switch transistors 54 are turned on when a variation in VDD power potential VDD supplied to the second power domain 31B has subsided after the standard cells 56 have started operating. That is, the gate electrodes 225 receives control signals that allow conduction between the power lines 6110 and the power lines 6120, and the gate electrodes 245 receive control signals that allow conduction between the power lines 6210 and the power lines 6220. As a result, stable VDD power potential is supplied to the first and second power domains 31A and 31B.

Thus, also the sixth variant can reduce generation of noise occurring due to a rush current.

Also in the other embodiments and variants, the fourth switch transistors 54 may be provided in addition to the second switch transistors 52. If the fourth switch transistors 54 are provided, the second switch transistors 52 need not be provided.

The third switch transistors 53 may be provided in addition to the first switch transistors 51. If the third switch transistors 53 are provided, the first switch transistors 51 need not be provided.

Second Embodiment

Figure 19:
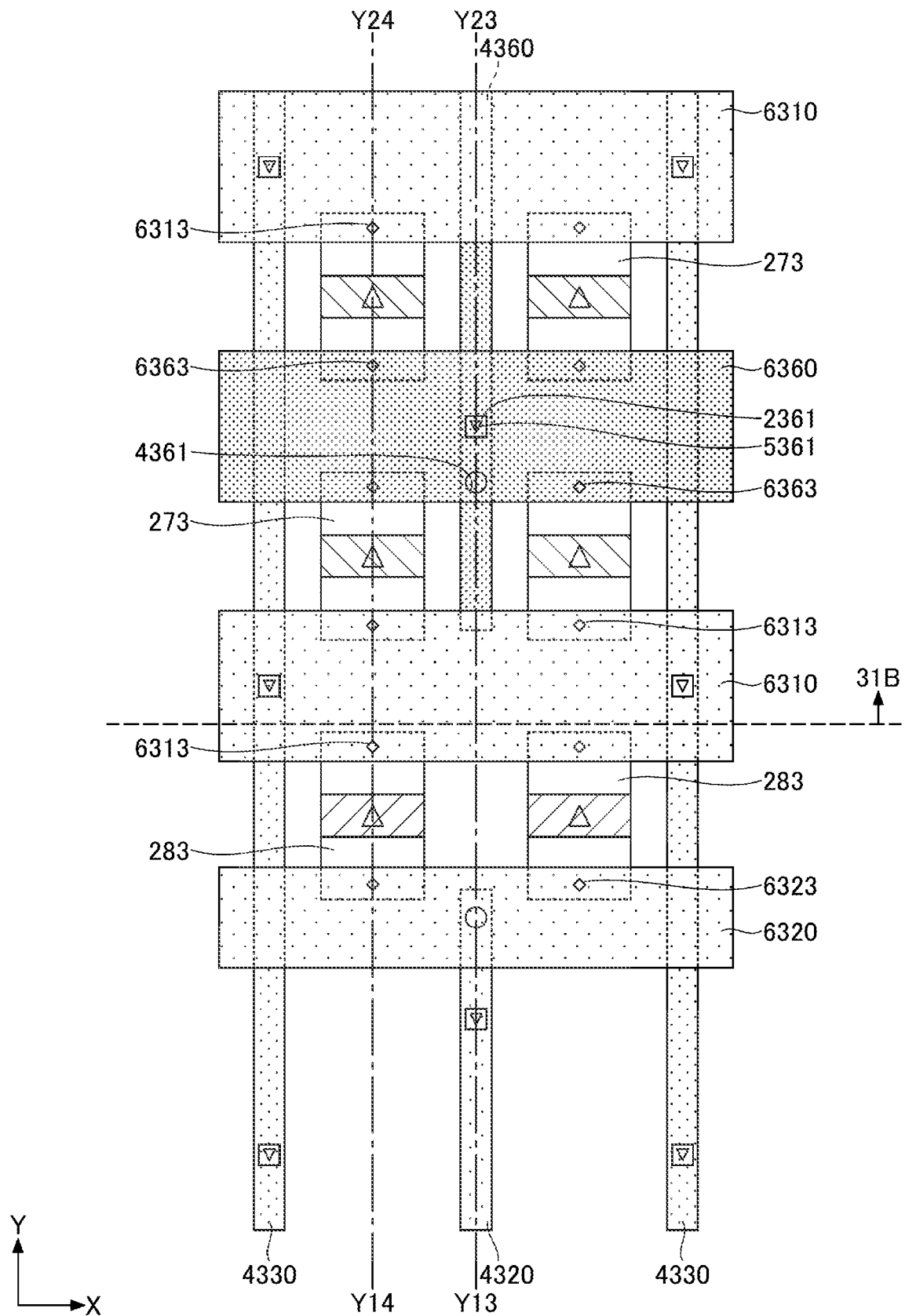
FIG. 19 is a schematic view depicting a configuration of a semiconductor device according to a second embodiment in plan view.
Figure 20:
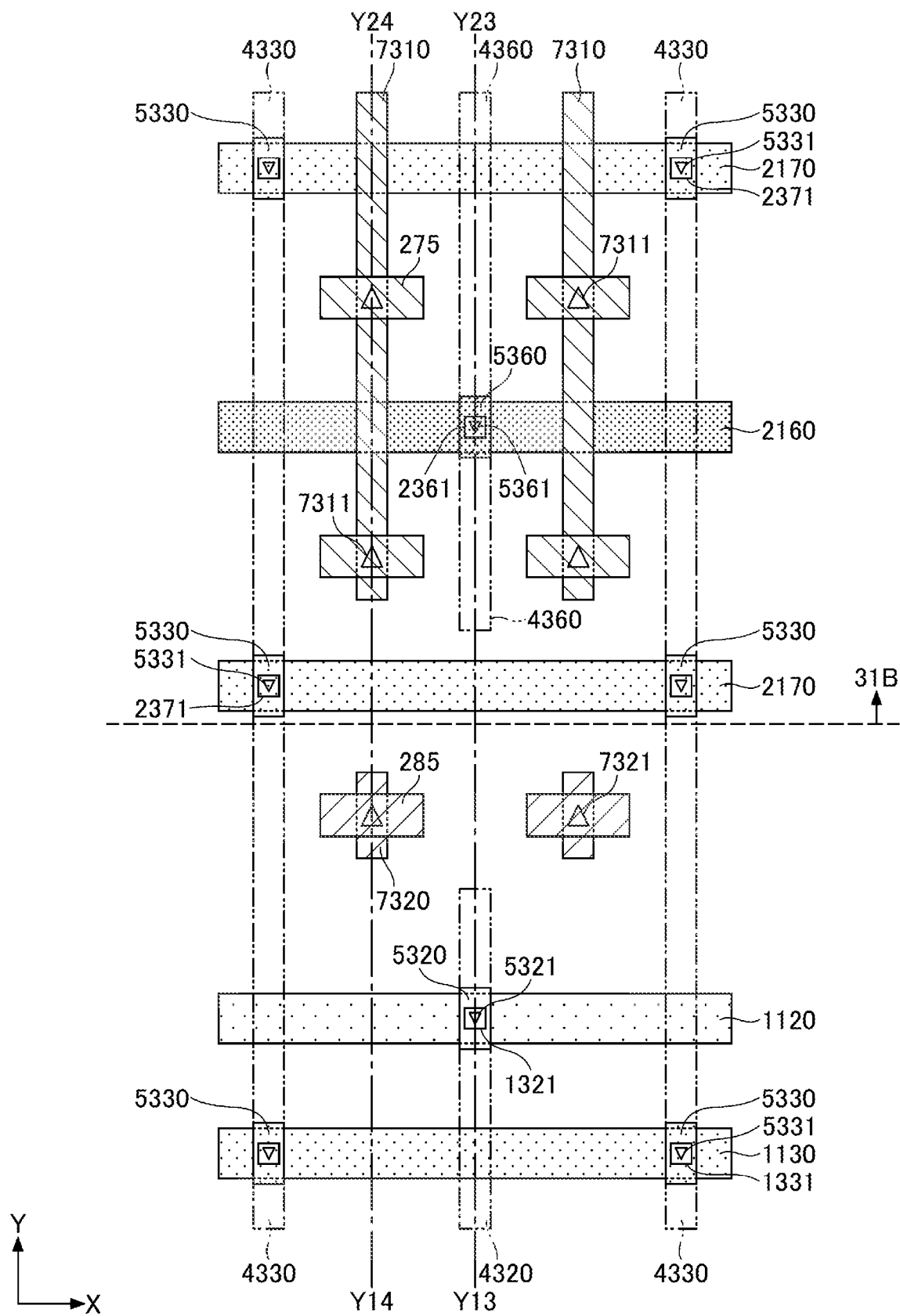
FIG. 20 is a schematic view depicting the configuration of the semiconductor device according to the second embodiment in plan view.
Figure 21:
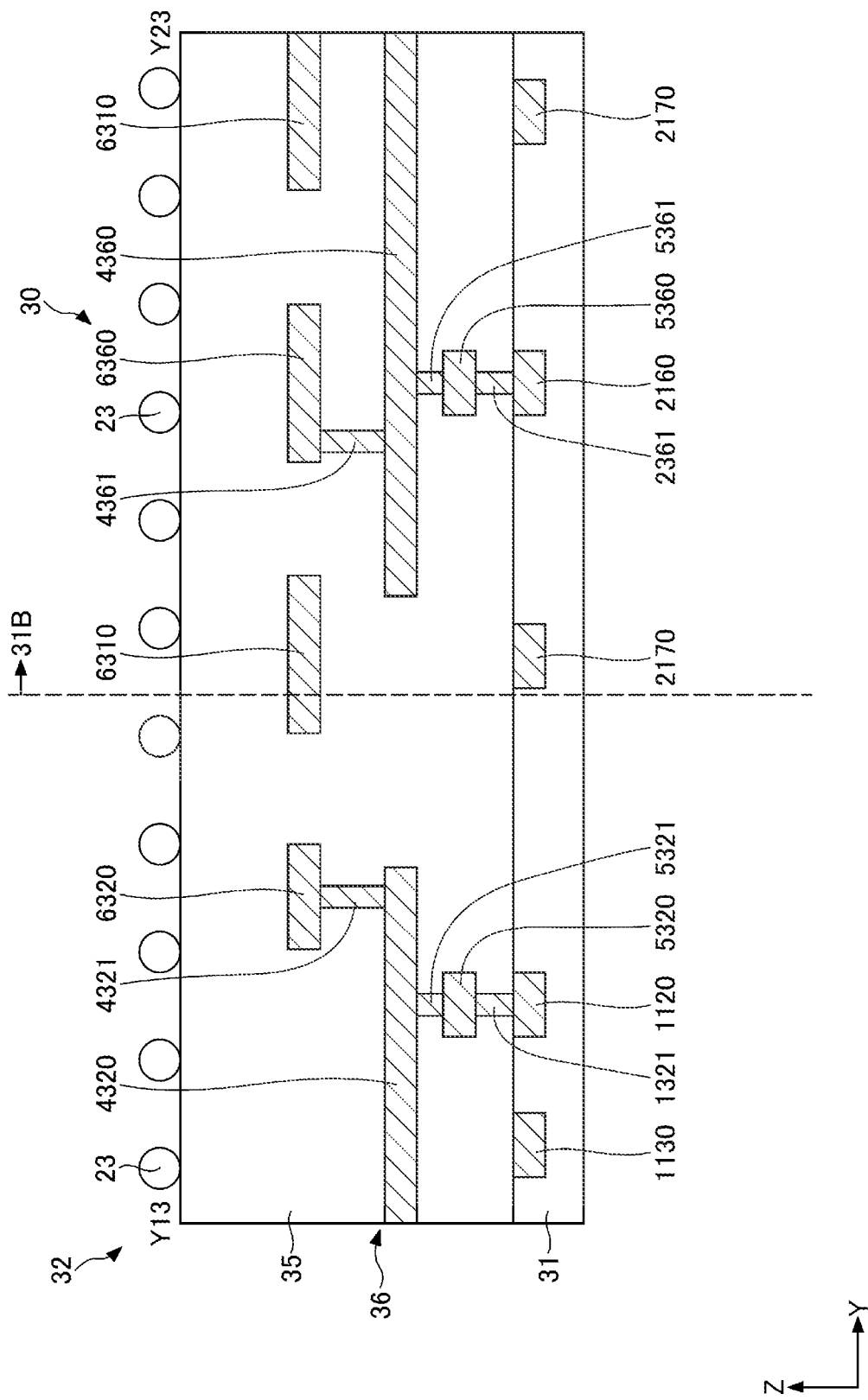
FIG. 21 is a cross-sectional view depicting the semiconductor device according to the second embodiment.
Figure 22:
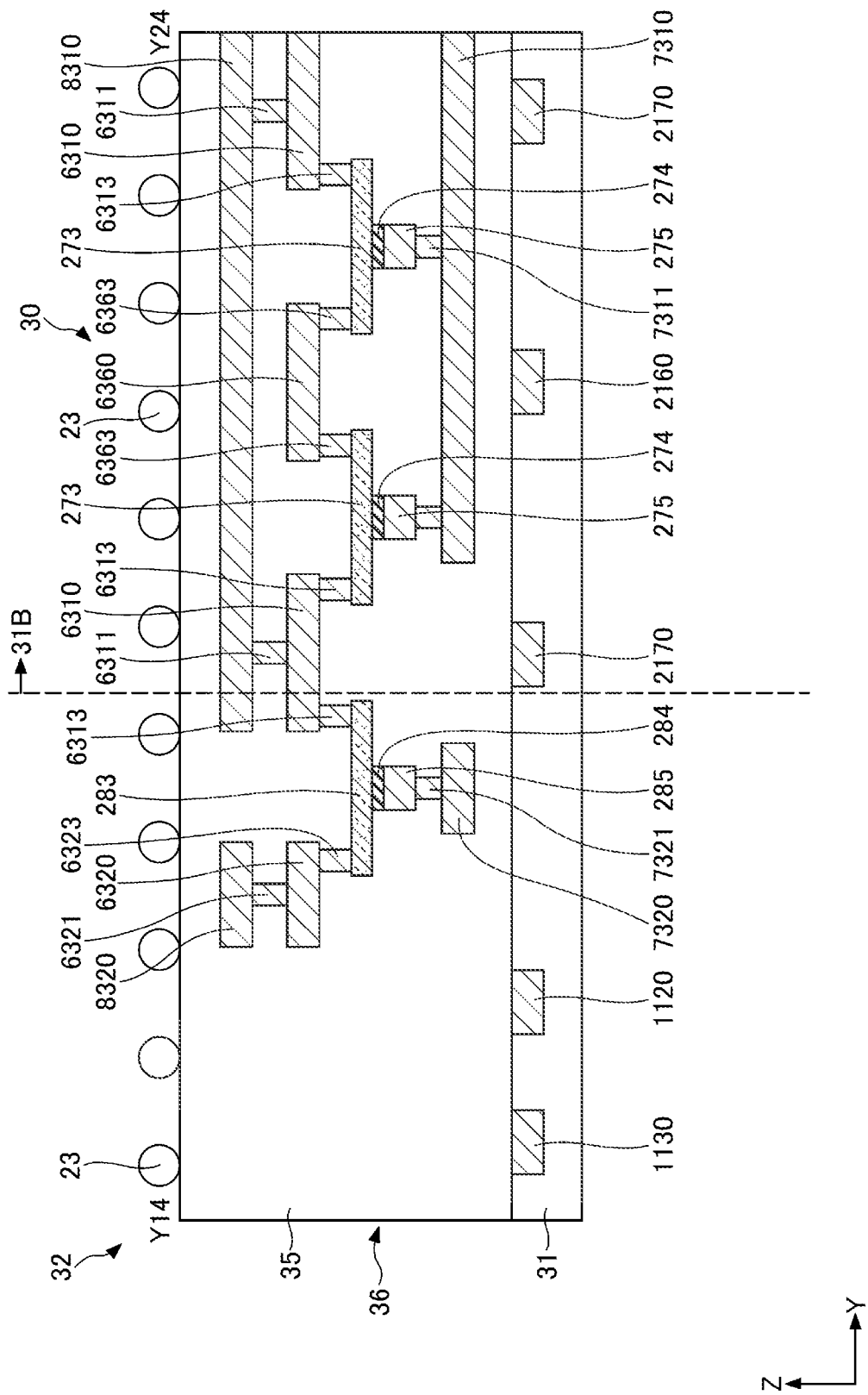
FIG. 22 is a cross-sectional view depicting the semiconductor device according to the second embodiment.

Next, a second embodiment will be described. The second embodiment differs from the first embodiment mainly in an arrangement of switch transistors. FIGS. 19 and 20 are schematic views depicting a configuration of a semiconductor device according to the second embodiment. FIGS. 21 and 22 are cross-sectional views depicting the semiconductor device according to the second embodiment. FIG. 19 mainly depicts power lines in an upper layer portion and FIG. 20 mainly depicts power lines in a lower layer portion. FIG. 21 corresponds to a cross-sectional view taken along the line Y13-Y23 in FIGS. 19 and 20, and FIG. 22 corresponds to a cross-sectional view taken along the line Y14-Y24 in FIGS. 19 and 20.

The semiconductor device according to the second embodiment includes a single chip 30. The chip 30 includes a substrate 31 and an wiring layer 36 on the substrate 31. The wiring layer 36 includes an insulating layer 35 and a plurality of power lines and vias formed in the insulating layer 35.

The chip 30 includes power line 2160 extending in the X-direction and power lines 2170 extending in the X-direction. For example, the power line 2160 correspond to a VVDD wiring and the power lines 2170 correspond to VSS wirings. Plural pairs of power lines 2160 and 2170 may be arranged where the power lines 2160 and 2170 are alternately arranged. The power line 2160 and the power lines 2170 are disposed in the second power domain 31B.

The chip 30 includes a power line 1120 extending in the X-direction and a power line 1130 extending in the X-direction which are disposed in the direction opposite to the Y-direction with respect to the power lines 2160 and 2170. The power line 1120 is located on the power line 2170 side of the power line 1130. For example, the power line 1120 corresponds to a VDD wiring electrically connected to the second power supply pad 82, and the power line 1130 corresponds to a VSS wiring.

As depicted in FIGS. 21 and 22, a plurality of grooves extending in the X-direction are formed on the substrate 31, and the power lines 2160, 2170, 1120, and 1130 are formed in these grooves.

In the second power domain 31B, circuits, such as standard cells 56, or the like, are connected between the power line 2160 and the power lines 2170, although not depicted in FIGS. 19-22.

Although not depicted in FIGS. 19-22, a first power domain 31A is disposed outside of the second power domain 31B, and circuits such as a first driving buffer 41, a second driving buffer 42, and control circuits therefor are connected between the power line 1120 and the power line 1130 in the first power domain 31A.

The wiring layer 36 includes control signal lines 7310, control signal lines 7320, a power line 5320, power lines 5330, and a power line 5360. The control signal lines 7310, the control signal lines 7320, the power line 5320, the power lines 5330, and the power line 5360 extend in the Y-direction. The power line 5320 intersects the power line 1120 at a right angle in plan view; the power lines 5330 intersect the power lines 1130 and 2170 at right angles in plan view; and the power line 5360 intersects the power line 2160 at a right angle in plan view. The insulating layer 35 has a via 1321 formed therein to connect the power line 5320 and the power line 1120, and vias 1331 formed therein to connect the power lines 5330 and the power lines 1130. The insulating layer 35 has vias 2371 formed therein to connect the power lines 5330 and power lines 2170, and a via 2361 formed therein to connect the power line 5360 and the power line 2160. The control signal lines 7310 intersect the power lines 2160 and 2170 at right angles in plan view.

Power lines 6310 are formed above the power lines 2170, and a power line 6360 is formed above the power line 2160. The power lines 6310 and 6360 extend in the X-direction. The insulating layer 35 has a plurality of semiconductor layers 273 formed therein and overlapping in plan view the power lines 6310 and 6360 that form adjacent pairs in a region that overlaps the second power domain 31B in plan view. Gate insulating films 274 are formed under the semiconductor layers 273, and gate electrodes 275 are formed under the gate insulating films 274. The gate insulating films 274 are in contact with the semiconductor layers 273 and the gate electrodes 275. The gate electrodes 275 are disposed between the power lines 6310 and the power line 6360 in plan view. The insulating layer 35 has vias 6313 formed therein to connect the semiconductor layers 273 and the power lines 6310, vias 6363 formed therein to connect the semiconductor layers 273 and the power line 6360, and vias 7311 formed therein to connect the control signal lines 7310 and the respective gate electrodes 275. The semiconductor layers 273, the gate insulating films 274, and the gate electrodes 275 are included in the first switch transistors 51.

A power line 6320 is formed in the same sub-wiring layer, as sub-wiring layer including the power lines 6310 and 6360, between the power line 1120 and the power lines 2170 in plan view. The power line 6320 extends in the X-direction. The insulating layer 35 has a plurality of semiconductor layers 283 formed therein to overlap in plan view the power line 6310 and 6320 forming an adjacent pair outside the region that overlaps the second power domain 31B in plan view. Gate insulating films 284 are formed under the semiconductor layers 283 and gate electrodes 285 are formed under the gate insulating films 284. The gate insulating films 284 are in contact with the semiconductor layers 283 and the gate electrodes 285. The gate electrodes 285 are positioned in plan view between the power line 6310 and the power line

6320. The insulating layer 35 has vias 6313 formed therein to connect the semiconductor layers 283 and the power lines 6310, vias 6323 formed therein to connect the semiconductor layers 283 and the power line 6320, and vias 7321 formed therein to connect the control signal lines 7320 and the respective gate electrodes 285. The semiconductor layers 283, the gate insulating films 284, and the gate electrodes 285 are included in the second switch transistors 52.

A power line 4360 extending in the Y-direction is formed between the power line 5360 and the power line 6360. The insulating layer 35 has a via 4361 formed therein to connect the power line 6360 and the power line 4360, and a via 5361 formed therein to connect the power line 4360 and the power line 5360.

A power line 4320 extending in the Y-direction is formed between the power line 5320 and the power line 6320. The insulating layer 35 has a via 4321 formed therein to connect the power line 6320 and the power line 4320, and a via 5321 formed therein to connect the power line 4320 and the power line 5320.

Power lines 4330 extending in the Y-direction are formed above the plurality of power lines 5330 arranged in the Y-direction. The power lines 4330 are formed in, for example, the same sub-wiring layer as the sub-wiring layer including the power lines 4320 and 4360. The insulating layer 35 has vias 5331 formed therein to connect the power lines 4330 and the power lines 5330.

Although not depicted in FIGS. 19 and 20, power lines 8310 may be formed extending in the Y-direction above the power lines 6310 and 6360, and vias 6311 may be formed connecting the power lines 8310 and the power lines 6310. Power line 8320 may be formed above the power line 6320, and vias 6321 may be formed connecting the power lines 8320 and the power line 6320.

Also in the second embodiment, when the standard cells 56 are to be operated, the first switch transistors 51 are turned on after the second switch transistors 52 are turned off. That is, after control signals are input to the gate electrodes 285 to avoid conduction between the power lines 6310 and the power line 6320, control signals are input to the gate electrodes 275 to allow conduction between the power lines 6310 and the power line 6360.

When the VDD power potential is applied to the power line 6360 (VVDD wiring), the standard cells 56 starts operating. At this time, in the present embodiment, because the second switch transistors 52 are in the turned-off states, a rush current is reduced and generation of noise is reduced.

The second switch transistors 52 are turned on when a variation in the VDD power potential supplied to the second power domain 31B has subsided after the standard cells 56 have started operating. That is, the gate electrodes 285 receive control signals to allow conduction between the power line 6310 and the power line 6320. As a result, a stable VDD power potential is supplied to the first and second power domains 31A and 31B.

Thus, also the present embodiment can reduce generation of noise occurring due to a rush current.

Figure 23:
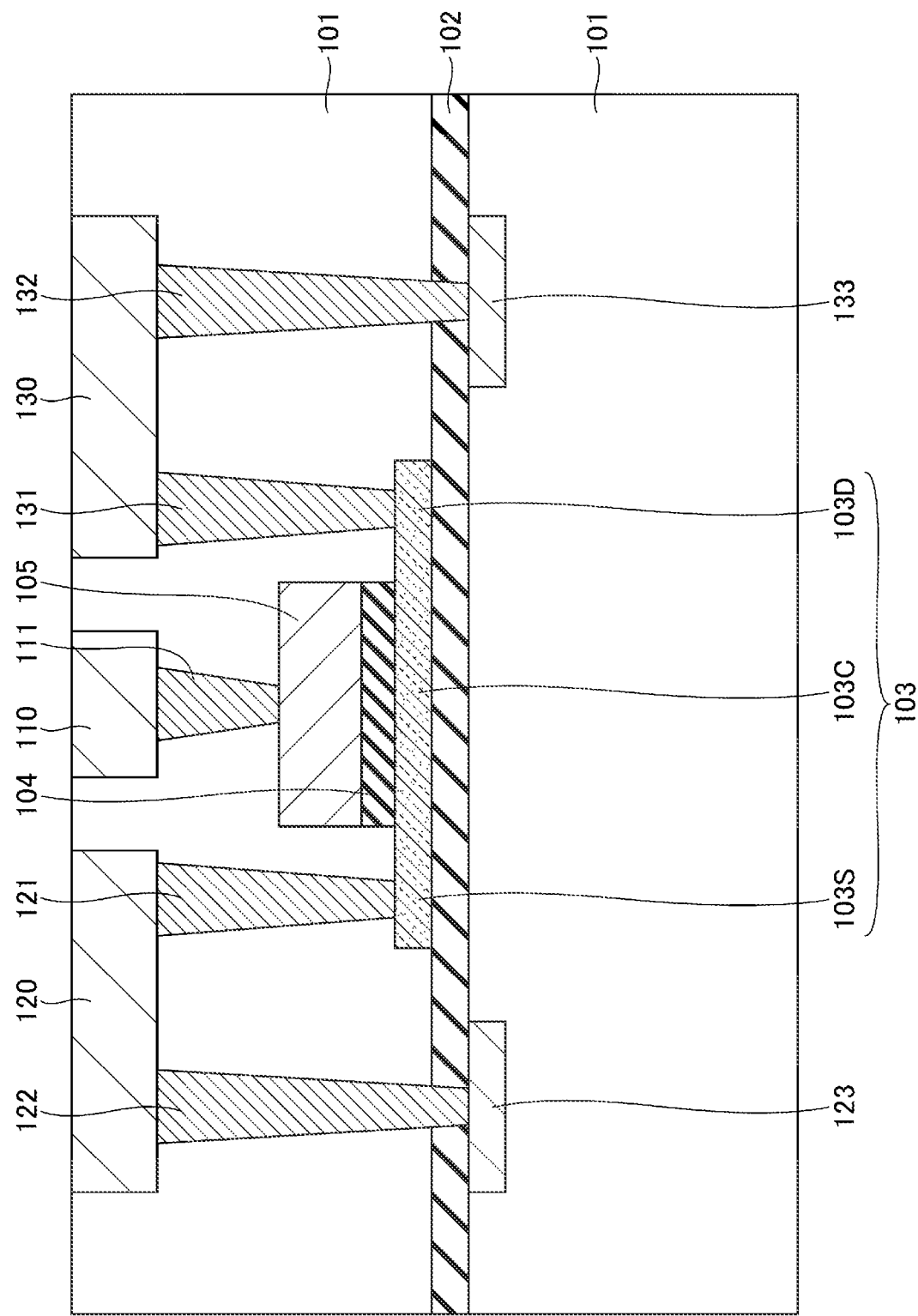
FIG. 23 is a cross-sectional view depicting an example of a cross-sectional configuration of a switch transistor.
Figure 24:
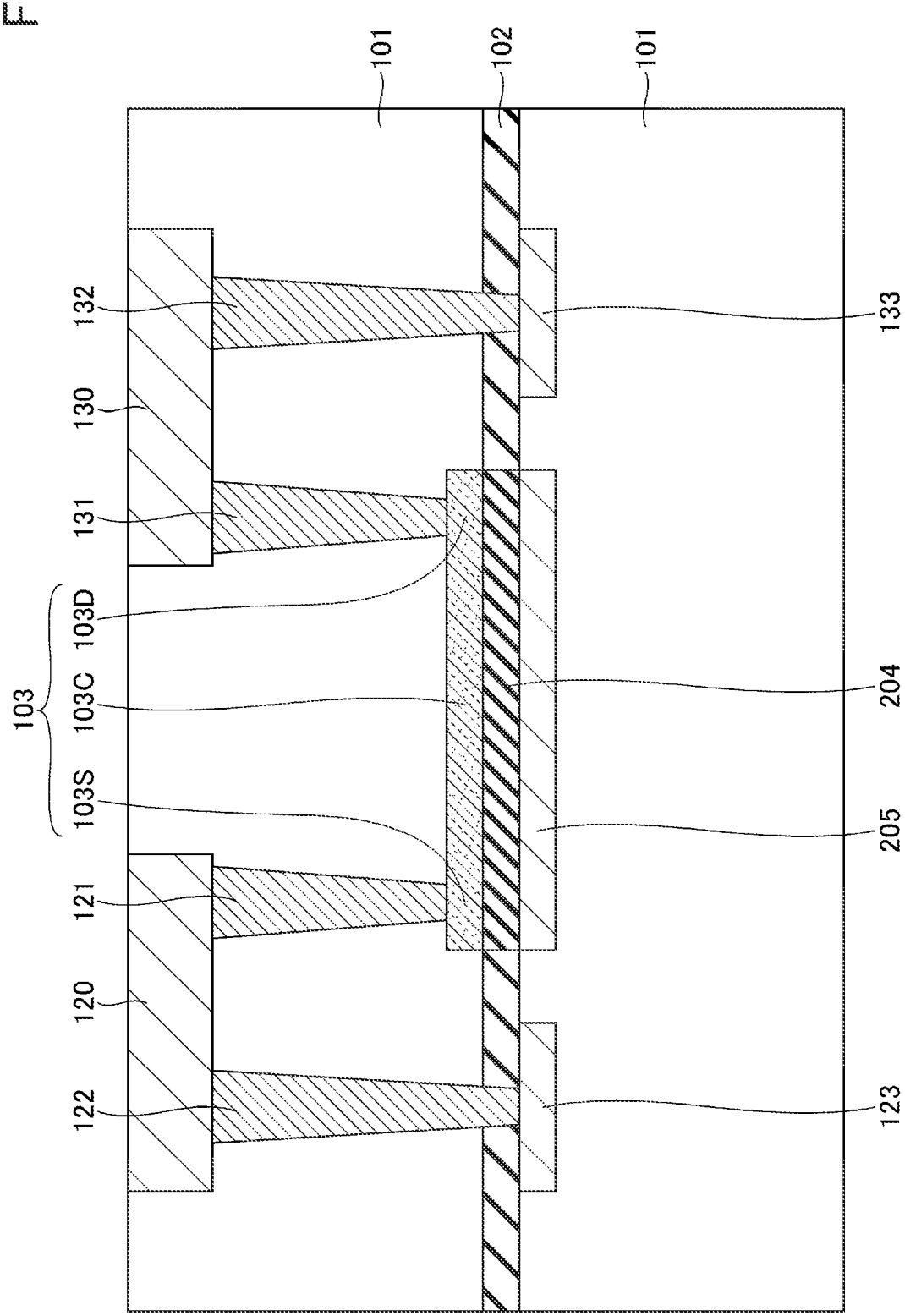
FIG. 24 is a cross-sectional view depicting an example of a cross-sectional configuration of a switch transistor.
Figure 25:
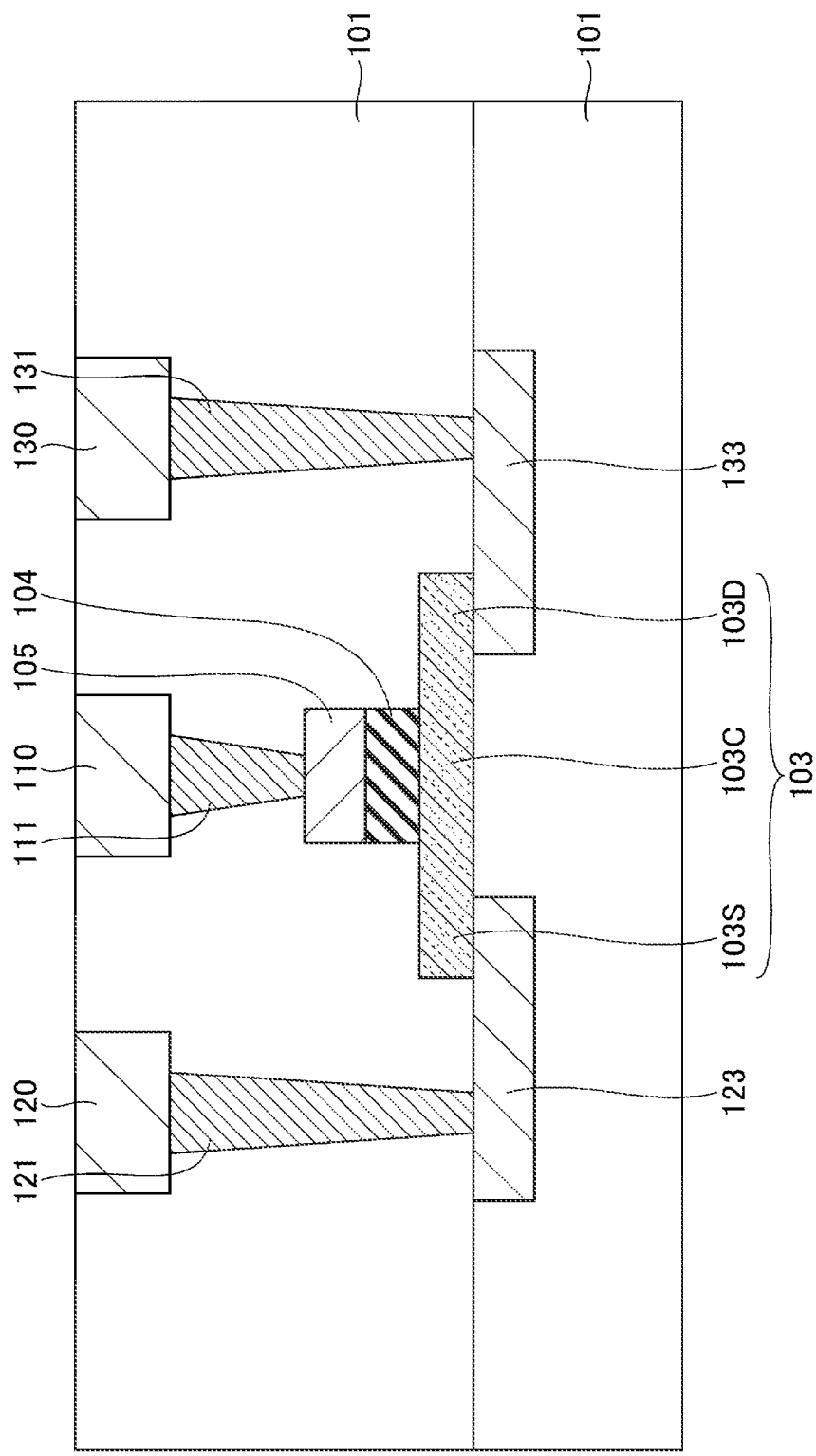
FIG. 25 is a cross-sectional view depicting an example of a cross-sectional configuration of a switch transistor.

Outlines of cross-sectional configurations of switch transistors will now be described. FIGS. 23-25 are cross-sectional views depicting examples of cross-sectional configurations of switch transistors.

In a first example depicted in FIG. 23, a base insulating film 102 is provided in an insulating layer 101; and a semiconductor layer 103, a gate insulating film 104, and a gate electrode 105 are provided on the base insulating film 102. A control signal line 110, a power line 120 corresponding to a VDD wiring, and a power line 130 corresponding to a VVDD wiring are provided in a surface layer portion of the insulating layer 101. The semiconductor layer 103 includes a channel 103C, a source 103S, and a drain 103D, the channel 103C being inserted between the source 103S and the drain 103D. The power line 120 and the source 103S are connected via a via 121, and the power line 130 and the drain 103D are connected via a via 131. A power line 123 corresponding to a VDD wiring and a power line 133 corresponding to a VVDD wiring are provided under the base insulating film 102. The power line 120 and the power line 123 are connected via a via 122, and the power line 130 and the power line 133 are connected via a via 132. A control signal line 110 is connected to the gate electrode 105 via a via 111.

In a second example depicted in FIG. 24, the base insulating film 102 includes a gate insulating film 204, the semiconductor layer 103 is provided on the gate insulating film 204, and a gate electrode 205 is provided under the gate insulating film 204. The other configurations are the same as or similar to those of the first example.

In a third example depicted in FIG. 25, the power line 123 is provided to be connected to the lower surface of the source 103S of the semiconductor layer 103, and the power line 133 is provided to be connected to the lower surface of the drain 103D of the semiconductor layer 103. The power line 120 is connected to the power line 123 via the via 121, and the power line 130 is connected to the power line 133 via the via 131. The other configurations are the same as or similar to those of the first example.

The material of the base insulating film may be, for example, silicon oxide, silicon nitride, silicon carbide, silicon oxide nitride, silicon oxide carbide, or the like. The material of the semiconductor layer is, for example, InGaZnO (IGZO), ZnO, ZnSnO, InZnO, or the like. The material of the gate insulating film may be, for example, $SiO_2$, $SiO_xN_y$, SiN, $Al_2O_3$, or the like. The material of the gate electrode is, for example, a metal such as molybdenum, titanium, chromium, tantalum, magnesium, silver, tungsten, aluminum, copper, neodymium, ruthenium, scandium, or the like. The material of the gate electrode may be graphene or the like.

The first to fourth switch transistors 51-54 provided in the above-described embodiments are classified into the first to third examples in view of the lamination relationships between the gate electrodes and the semiconductor layers and the connection relationships between the semiconductor layers and the VDD wirings as follows. That is, the first to fourth switch transistors 51-54 provided in the first embodiment, the first to fourth variants of the first embodiment, and the sixth variant of the first embodiment are classified as the third example. The first to fourth switch transistors 51-54 provided in the fifth variant of the first embodiment are classified as the first example. The first to fourth switch transistors 51-54 provided in the second embodiment are classified as the second example.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a depicting of the superiority and inferiority of the invention. Although the semiconductor devices have been described with reference to the embodiments, it should be understood that the present invention is not limited to these embodiments, and the various changes, substitutions, and alterations could be made hereto without departing from the spirit and scope of the present invention.

What is claimed is:

1. A semiconductor device comprising:
    a first chip including a substrate and a first wiring layer formed on a first surface of the substrate; and
    a second chip formed on a second surface of the substrate opposite to the first surface of the substrate, the second chip including a second wiring layer formed on the second surface of the substrate opposite to the first surface of the substrate, wherein:
    the second wiring layer of the second chip includes;
        a first power line to which a first power potential is applied,
        a second power line to which a second power potential is applied,
        a third power line to which a third power potential is applied,
        a first switch connected between the first power line and the second power line, and
        a second switch provided on one of the first power line or the third power line, and
    the first chip includes a first circuit provided between the first power line and the third power line.

2. The semiconductor device as claimed in claim 1, wherein
    the second switch is provided on the first power line.

3. The semiconductor device as claimed in claim 1, wherein
    the second switch includes
        a first terminal electrically on the first circuit side; and
        a second terminal electrically opposite to the first terminal, and
    the first chip includes a second circuit connected between the second terminal and another one of the first power line or the third power line.

4. The semiconductor device as claimed in claim 3, wherein
    the second circuit includes
        a first control buffer configured to control the first switch, and
        a second control buffer configured to control the second switch.

5. The semiconductor device as claimed in claim 1, wherein
    the second wiring layer includes
        a fourth power line to which a fourth power potential is applied,
        a third switch connected between the third power line and the fourth power line, and
        a fourth switch provided on another of the first power line or the third power line, and
    the first circuit is connected between the fourth power line and the second power line.

6. The semiconductor device as claimed in claim 1, wherein
    the second wiring layer includes
        a fourth power line to which a fourth power potential is applied,
        a third switch connected between the third power line and the fourth power line, and
        a fourth switch provided on another of the first power line or the third power line,
    the first circuit is connected between the fourth power line and the second power line,
    the second switch includes
        a first terminal electrically on the first circuit side, and
        a second terminal electrically opposite to the first terminal,
    the fourth switch includes
        a third terminal electrically on the first circuit side, and
        a fourth terminal electrically opposite to the third terminal, and
    the first chip includes a second circuit connected between the second terminal and the fourth terminal.

7. The semiconductor device as claimed in claim 6, wherein
    the fourth switch is provided on the third power line, and
    the second switch is provided on the first power line.

8. The semiconductor device of claim 6, wherein
    the second circuit includes
        a first control buffer configured to control the first switch,
        a second control buffer configured to control the second switch,
        a third control buffer configured to control the third switch, and
        a fourth control buffer configured to control the fourth switch.

9. The semiconductor device as claimed in claim 1, wherein
    the third power line is a grounding wiring to which a ground potential is applied.

10. The semiconductor device according to claim 1, wherein
    the first power line includes a first wiring and a second wiring,
    the second power line includes a third wiring,
    the second switch is provided between the first wiring and the second wiring, and
    the first switch is provided between the second wiring and the third wiring.

11. The semiconductor device as claimed in claim 10, wherein
    the first wiring and the second wiring extend in a first direction in plan view, and
    the second switch and at least one other second switch are arranged in the first direction.

12. The semiconductor device as claimed in claim 11, wherein
    the second wiring, the third wiring, and at least one other second wiring or third wiring extend in the first direction in plan view,
    the second wiring, the third wiring, and the at least one other second wiring or third wiring are arranged alternately in a second direction different from the first direction in plan view, and
    the first switch and at least one other first switch are disposed between the second wiring, the third wiring, and the at least one other second wiring or third wiring.

13. The semiconductor device as claimed in claim 12, wherein
    the third power line includes a fourth wiring that is disposed above the first wiring, the second wiring, the third wiring, and the at least one other second wiring or third wiring, and extends in the second direction in plan view,
    the first power line includes a fifth wiring that is connected to the first wiring, is disposed above the first wiring, and extends in the second direction in plan view,
    the second power line includes a sixth wiring that is connected to the third wiring, is disposed above the second wiring and the third wiring, and the at least one other second wiring or third wiring, and extends in the second direction in plan view, and the fifth wiring is disposed on an extension of the sixth wiring along the second direction.

14. The semiconductor device as claimed in claim 10, wherein in plan view, the first wiring surrounds a first region that includes the first circuit, and in plan view, at least a portion of the second wiring overlaps the first region.

15. The semiconductor device as claimed in claim 1, wherein the second wiring layer includes a plurality of sub-wiring layers stacked with each other, and the second switch is provided in the plurality of sub-wiring layers.

* * * * *